United States Patent
Zach et al.

(10) Patent No.: US 7,588,868 B2
(45) Date of Patent: Sep. 15, 2009

(54) METHOD AND SYSTEM FOR REDUCING THE IMPACT OF ACROSS-WAFER VARIATIONS ON CRITICAL DIMENSION MEASUREMENTS

(75) Inventors: Franz X. Zach, Los Gatos, CA (US); Abdurrahman Sezginer, Los Gatos, CA (US); Gokhan Percin, Los Gatos, CA (US)

(73) Assignee: Cadence Design Systems, Inc., San Jose, CA (US)

( * ) Notice: Subject to any disclaimer, the term of this patent is extended or adjusted under 35 U.S.C. 154(b) by 704 days.

(21) Appl. No.: 10/971,350

(22) Filed: Oct. 22, 2004

(65) Prior Publication Data

US 2006/0073686 A1  Apr. 6, 2006

Related U.S. Application Data

(63) Continuation-in-part of application No. 10/960,357, filed on Oct. 6, 2004, now abandoned.

(51) Int. Cl.
G03F 9/00 (2006.01)
G03C 5/00 (2006.01)
(52) U.S. Cl. .......................... 430/22; 430/30
(58) Field of Classification Search .............. 430/22, 430/30
See application file for complete search history.

(56) References Cited

U.S. PATENT DOCUMENTS

| | | | |
|---|---|---|---|
| 5,308,991 A | 5/1994 | Kaplan | |
| 5,528,508 A | 6/1996 | Russell et al. | |
| 5,573,890 A | 11/1996 | Spence | |
| 5,705,301 A | 1/1998 | Garza et al. | |
| 5,858,580 A | 1/1999 | Wang et al. | |
| 5,862,058 A | 1/1999 | Samuels et al. | |
| 5,888,675 A | 3/1999 | Moore et al. | |
| 5,978,085 A | 11/1999 | Smith et al. | |
| 6,048,651 A | 4/2000 | Brunner et al. | |
| 6,091,486 A | 7/2000 | Kirk | |
| 6,130,747 A | 10/2000 | Nomura et al. | |
| 6,194,102 B1 * | 2/2001 | Nakasuji et al. ................ | 430/5 |
| 6,269,472 B1 | 7/2001 | Garza et al. | |
| 6,289,499 B1 | 9/2001 | Rieger et al. | |
| 6,303,251 B1 | 10/2001 | Mukai et al. | |
| 6,311,319 B1 | 10/2001 | Tu et al. | |
| 6,356,345 B1 | 3/2002 | McArthur et al. | |
| 6,396,569 B2 | 5/2002 | Zheng et al. | |
| 6,399,261 B1 * | 6/2002 | Sandstrom ................... | 430/30 |
| 6,403,477 B1 | 6/2002 | Tounai | |
| 6,413,683 B1 | 7/2002 | Liebmann et al. | |
| 6,430,737 B1 | 8/2002 | Cobb et al. | |
| 6,444,373 B1 | 9/2002 | Subramanian et al. | |
| 6,453,452 B1 | 9/2002 | Chang et al. | |
| 6,453,457 B1 | 9/2002 | Pierrat et al. | |
| 6,470,489 B1 | 10/2002 | Chang et al. | |
| 6,529,623 B1 | 3/2003 | Kent | |
| 6,532,585 B1 | 3/2003 | Petranovic et al. | |
| 6,553,559 B2 | 4/2003 | Liebmann et al. | |
| 6,584,609 B1 | 6/2003 | Pierrat et al. | |
| 6,646,729 B2 | 11/2003 | van der Laan et al. | |
| 6,686,100 B2 | 2/2004 | Martin et al. | |
| 7,129,024 B2 * | 10/2006 | Ki ............................... | 430/296 |
| 7,332,251 B2 * | 2/2008 | Choi, Jae Seung ............. | 430/5 |
| 2002/0091986 A1 | 7/2002 | Ferguson et al. | |
| 2002/0138810 A1 | 9/2002 | Lavin et al. | |
| 2003/0003385 A1 | 1/2003 | Martin | |
| 2003/0088847 A1 | 5/2003 | Chang et al. | |
| 2003/0098970 A1 | 5/2003 | Chen | |
| 2003/0121021 A1 | 6/2003 | Liu et al. | |
| 2003/0192013 A1 | 10/2003 | Cote et al. | |
| 2003/0192025 A1 | 10/2003 | Liu | |

FOREIGN PATENT DOCUMENTS

GB    2375403    11/2003

OTHER PUBLICATIONS

"Correcting Design Data for Manufacture," U.S. Appl. No. 10/860,852, filed Jun. 4, 2004, inventors: Vishnu Kamat.

"Method of Characterizing Flare," Invarium, Inc. patent application No. 10/860,853, filed Jun. 4, 2004, inventors: Bo Wu, Abdurrahman Sezginer.

(Continued)

*Primary Examiner*—Christopher G Young
(74) *Attorney, Agent, or Firm*—Sheppard Mullin Richter & Hampton LLP

(57) ABSTRACT

First and second exposures of a mask onto a wafer are performed such that the exposure field of the second exposure partially overlaps the exposure field of the first exposure. A characteristic of a set of features is determined, and a value of a parameter of an optical proximity correction model is determined. An alignment feature can be used to align a measurement tool. In yet another embodiment, pupil intensity distribution of an imaging system is measured by exposing an image field of a radiation detector with a bright feature, positioning the detector at a distance away from the image plane, and exposing the image field of the detector with a bright feature, resulting in a cumulative exposure of the image field of the detector from the two exposures. A characteristic of a spatial pattern in the cumulative exposure of the image field of the detector is then determined.

42 Claims, 17 Drawing Sheets

OTHER PUBLICATIONS

"Method for Characterization of the Illuminator in a Lithographic System," U.S. Appl. No. 10/960,357, filed Oct. 6, 2004, inventors: Franz X. Zach, Bo Wu, and Abdurrahman Sezinger.

"System and Method for Compensating for Aberrations in a Photolithographic Process," U.S. Appl. No. 10/841,025, filed May 7, 2004, inventor: Roy V. Prasad.

"System and Method for Reducing Patterning Variability in Integrated Circuit Manufacturing through Mask Layout Corrections," U.S. Appl. No. 10/841,079, filed May 7, 2004, inventors: Roy V. Prasad, Chi-Song Horng, and Ram S. Ramanujam.

"Method and System for Designing Manufacturable Patterns that Account for the Pattern- and Position-Dependent Nature of Patterning Processes," U.S. Appl. No. 10/861,170, filed Jun. 4, 2004, inventor: Abdurrahman Sezinger.

"Characterizing Flare of a Projection Lens," U.S. Appl. No. 10/933,090, filed Sep. 1, 2004, inventors: Bo Wu, Abdurrahman Sezginer, Franz X. Zach.

"Method for Correcting Position-Dependent Distortions," U.S. Appl. No. 10/933,192, filed Aug. 31, 2004, inventors: Devendra Joshi, Abdurrahman Sezginer, Franz X. Zach.

A. K-T Wong, Resolution enhancement techniques in optical lithography, SPIE Press, vol. TT47, Bellingham, WA, pp. 91-115, 2001.

H. J. Levinson, Principles of Lithography, SPIE Press, Bellingham, WA, pp. 257-283 and 771-802, 2001.

Abramowitz, M. and Stegun, I. A. (Eds.), Ch. 22, Handbook of Mathematical Functions with Formulas, Graphs, and Mathematical Tables, 9th printing. New York: Dover, pp. 771-802, 1972.

Born, M. and Wolf, E., Principles of Optics, Ch. 9, 6th ed. New York: Pergamon Press, pp. 459-490 and 523-527, 1989.

C. Bodendorf, et al., Impact of measured pupil illumination fill distribution on lithography simulation and OPC models, Proc. SPIE vol. 5377, Article 110, 2004.

G. McIntyre et al., "Characterizing illumination angular uniformity with phase shifting masks," Proc. SPIE vol. 5040, Article 16, 2003, SPIE Bellingham, WA.

C. Mack, "Inside PROLITH: A Comprehensive Guide to Optical Lithography Simulation," pp. 67-112, 1997, Finle Technologies, Austin, TX.

Robertson et al., "An Improved Notch Model for Resist Dissolution in Lithography Simulation," SPIE vol. 4345, 9 pages (undated).

D.G. Flagello, "Theory of high-Na imaging in homogeneous thin films," Optical Society of America, A, vol. 13, No. 1, 1996.

E. Luce et al., "Flare impact on the intrafield CD control for sub-0.25 um patterning," SPIE vol. 3679, p. 368-381, Mar. 1999.

Gill, P. R.; Murray, W.; and Wright, M. H. "The Levenberg-Marquardt Method," §4.7.3 in Practical Optimization. London: Academic Press, pp. 136-137, 1981.

Golub, G. H. and Van Loan, C. F., Matrix Computations, Sect. 2.5.3 and 2.5.6, 3rd ed. Baltimore, MD: Johns Hopkins University Press, 1996.

Granik, "Dry etch proximity modeling in mask fabrication," Yuri Publication: Proc. SPIE vol. 5130, p. 86-91, Photomask and Next-Generation Lithography Mask Technology X; Hiroyoshi Tanabe; Ed. (Aug. 2003).

H. Nomura et al., "Higher order aberration measurement with printed patterns under extremely reduced 6 illumination," Proc. Spie vol. 3679, p. 358-367, SPIE, Bellingham, WA, 1999.

J.P. Kirk et al., "Application of blazed gratings for determination of equivalent primary azimuthal aberrations," Proc. SPIE vol. 3679, p. 70-76, 1999.

J. P. Cain, "Characterization of Spatial Variation in Photolithography," M.S. thesis, University of California, Berkeley, 2002.

J.A. Kong, Electromagnetic Wave Theory, John Wiley & Sons, 2nd Ed., pp. 370-403, 1990.

J.M. Geary, Introduction to Wavefront Sensors, vol. TT18, SPIE Optical Engineering Press, Bellingham, WA, pp. 53-103, 1995.

J.P. Kirk, "Scattered light in photolithographic lenses," Proc SPIE 2197, p. 566-572, SPIE, Bellingham, WA, 1994.

Kirkpatrick, S., C. D. Gelatt Jr., M. P. Vecchi, "Optimization by Simulated Annealing," Science, 220, No. 4598, pp. 671-680, 1983.

Koza, J. R., "Genetic Programming: On the Programming of Computers by Means of Natural Selection," Cambridge, MA: MIT Press, 1992.

M. Terry et al., "Behavior of lens aberrations as a function of wavelength on KrF and ArF lithography scanners," Proc. SPIE vol. 4346, p. 15-24, 2001.

Mark van der Kerkof, et al, "Full optical column characterization of DUV lithographic projection tools," SPIE 29th Annual International Symposium on MicroLithography, paper 5377, Article 212, Feb. 22-27, 2004, Santa Clara, CA.

Metropolis, N., A. Rosenbluth, M. Rosenbluth, A. Teller, E. Teller, "Equation of State Calculations by Fast Computing Machines," J. Chem. Phys., 21, 6, 1087-1092, 1953.

Nomura, "New phase shift gratings for measuring aberrations," Proc. SPIE vol. 4346, p. 25-35, 2001.

P. Dirksen et al., "Determination of resist parameters using the extended Nijboer-Zernike theory," Proc. SPIE vol. 5377, Article 13, SPIE, Bellingham, 2004.

Press, W. H.; Flannery, B. P.; Teukolsky, S. A.; and Vetterling, W. T. "Interpolation and Extrapolation." Ch. 3 in Numerical Recipes in FORTRAN: The Art of Scientific Computing, 2nd ed. Cambridge, England: Cambridge University Press, pp. 99-122, 1992.

Schneider et al. "Compensation of long-range process effects on photomasks by design data correction," Proc. SPIE vol. 5148, p. 179-188, 19th European Conference on Mask Technology for Integrated Circuits and Microcomponents; Jun 2003.

T. Brunner et al., "Impact of resist blur on MEF, OPC and CD control," Proc. SPIE 5377, SPIE Bellingham, WA, 2004.

J.P. Stirniman, M.L. Rieger, "Fast proximity correction with zone sampling," Proc. SPIE, vol. 2197, pp. 294-301, 1994.

Nicolas Bailey Cobb, "Fast Optical and Process Proximity Correction algorithms for integrated circuit manufacturing," Ph.D. Thesis, Univ. Of Calif., 123 pp., 1998.

Frank M. Schellenberg, "Resolution Enhancement with OPC/PSM," Future Fab Intl., vol. 9, Jan. 2000.

Haolin Zhang, "Causal Analysis of Systematic Spatial Variation in Optical Lithography," Ph.D. Thesis, Univ. Of Calif., Berkeley, 14 pages, Jun. 2002.

Jason P. Cain and Costas J. Spanos, "Electrical linewidth metrology for systematic CD variation characterization and causal analysis," Proc. SPIE, vol. 5038, pp. 350-361, 2003.

Liebmann, "Layout Impact of Resolution Enhancement Techniques: Impediment or Opportunity?," ISPD '03, Monterey, CA, pp. 110-117, Apr. 2003.

"Litel Instruments—ISI Product Overview," http://litel.net/isi_product.htm, 2 pages, printed Jan. 26, 2004.

"'The MEEF Meter': a Realistic Approach for Lithography Process Monitoring," Yield Management Solutions, pp. 52-57 (Aug. 2000).

Granik et al., "New Process Models for OPC at sub-90nm Nodes," Deep Submicron Technical Publications, presented at SPIE 2003, 11 pages, May 2003.

Wojcik et al., "Laser Alignment Modeling Using Rigorous Numerical Simulations," SPIE vol. 1463 Optical/Laser Microlithography IV, pages 292-303, 1991.

J. P. Kirk et al. "Pupil Illumination; in situ measurement of partial coherence", Proc. SPIE vol. 3334, 1998, p. 281-288.

F. Zach et al. "Aberration Analysis using Reconstructed Aerial images of Isolated Contacts on Attenuated Phase shift masks."

P. Dirksen et al, "Characterization of a Projection Lens Using the Extended Nijboer-Zernike Approach," Proc. SPIE vol. 4691 (2002), p. 1392.

N. Cobb et al., "Mathematical and CAD Framework for Proximity Correction," Proceedings of the SPIE, vol. 2726 (1996), p. 208.

T. A. Brunner, "Approximate Models for Resist Processing Effects," SPIE vol. 2726 (1996), p. 198.

J. Schacht et al., "Calibration of OPC models for multiple focus conditions," Proc. SPIE. vol. 5377 (2004), p. 691-702.

Born and Wolf, "Principles of Optics," Cambridge University Press, 7th edition, pp. 459-490, 1999.

N. Cobb, "Fast Optical and Process Proximity Correction Algorithms for Integrated Circuit Manufacturing," Ph.D. Thesis, University of California, Berkeley, 1998.

A. Rosenbluth et al., "Fast Calculation of Images for High Numerical Aperture Lithography," Proceedings of the SPIE vol. 5377 (2004), p. 615.

F. Zach, "Neural Network Based Approach to Resist Modeling and OPC," Proceedings of the SPIE, vol. 5377 (2004) p. 670.

Dirksen et al., "Novel Aberration Monitor for Optical Lithography," Proc. SPIE vol. 3679 (1999), p. 77.

Erdmann et al., "Comparison of Simulation Approaches for Chemically Amplified Resists," SPIE vol. 4404, 12 pages (undated).

F. Zach et al. "Aberration Analysis using Reconstructed Aerial images of Isolated Contacts on Attenuated Phase shift masks.", Proc. SPIE vol. 4346 (2001), p. 1362-1368.

* cited by examiner

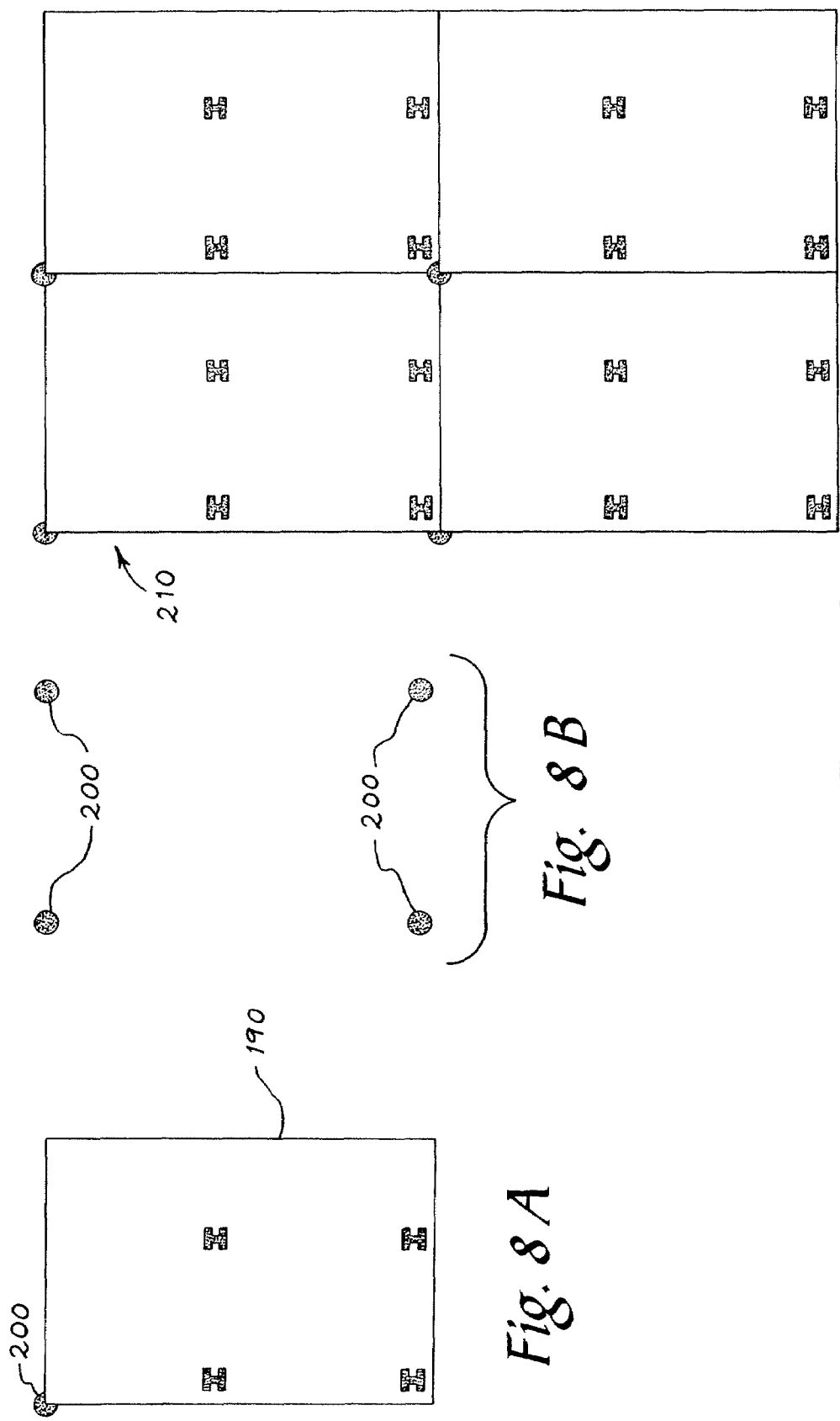

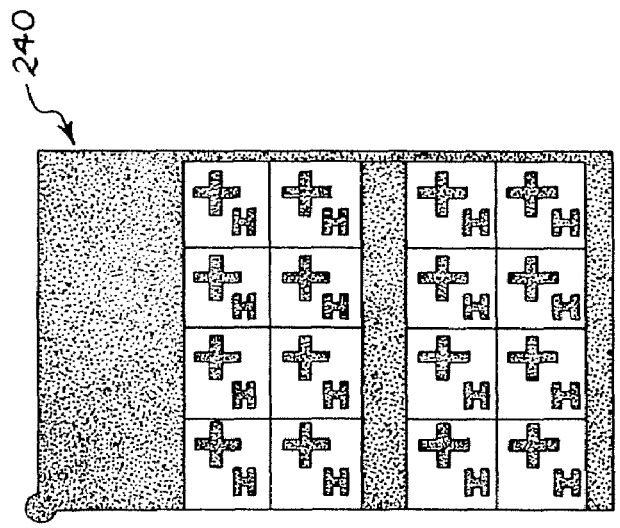
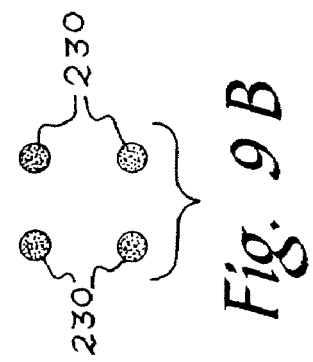
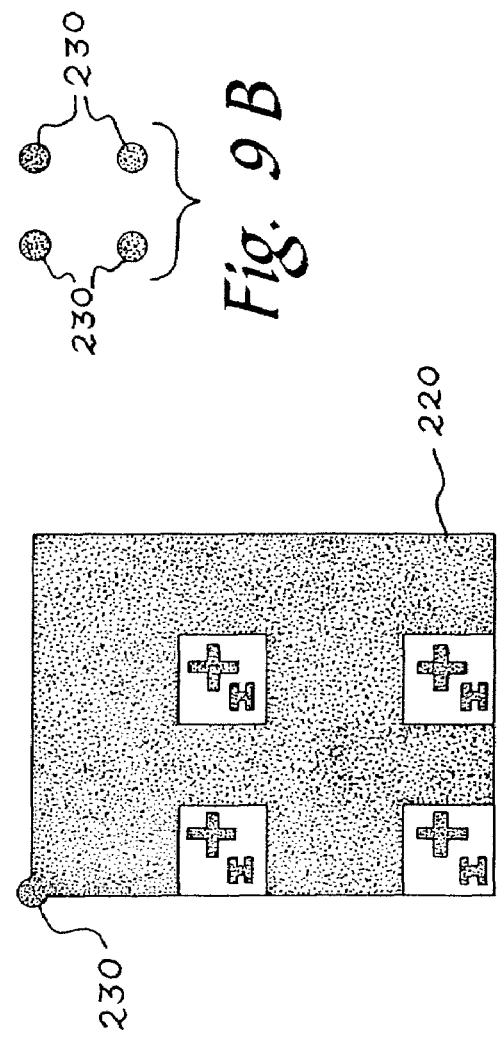
Fig. 9A
Fig. 9B
Fig. 9C

Exposures:
- first exposure: In focus, provides reference mark for image registration
- second exposure: large out of focus condition
Dose 1 Dose 2
First, in focus exposure
Provides image
registration mark for pupil
First, in focus exposure
Provides image
registration mark for pupil
 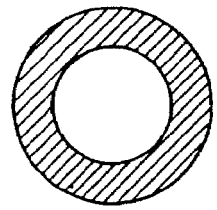  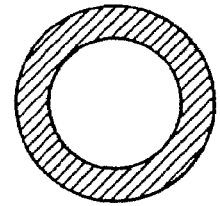
Second, out of focus exposure
Second, out of focus exposure
*Fig. 18*

METHOD AND SYSTEM FOR REDUCING THE IMPACT OF ACROSS-WAFER VARIATIONS ON CRITICAL DIMENSION MEASUREMENTS

CROSS-REFERENCE TO RELATED APPLICATIONS

This application is a continuation-in-part of U.S. patent application Ser. No. 10/960,357, now abandoned filed Oct. 6, 2004, which is assigned to the assignee of the present application and is hereby incorporated by reference.

Also, subject matter disclosed in this application might be considered to be related to subject matter disclosed in co-pending patent application Ser. No. 10/861,170 filed Jun. 4, 2004 and co-pending patent application Ser. No. 10/933,090 filed Sep. 1, 2004, both of which are assigned to the assignee of the present application and the entire disclosure of each of which is hereby incorporated by reference herein for all purposes.

FIELD OF THE PRESENTLY PREFERRED EMBODIMENTS

This document comprises two sections. The first section relates to a method and system for reducing the impact of across-wafer variations on critical dimension measurements. This section presents embodiments generally related to the field of optical lithography, more specifically to the area of optical proximity corrections. A method of determining the parameters for an optical proximity correction (OPC) model calibration is disclosed that minimizes the deleterious impact of across-wafer variations on the experimental data. The second section, which corresponds to the text in parent U.S. patent application Ser. No. 10/960,357, filed Oct. 6, 2004, relates to a method for characterization of the illuminator in a lithographic system.

BACKGROUND

Background of Section I

The patterning process in semiconductor manufacturing involves several steps, including mask manufacturing, optical exposure, resist processing, and reactive ion etching. Models can be used to describe, for example, lens aberrations present in the optical exposure step. These models are built by measuring various characteristics of a pattern exposed across a wafer. In practice, a pattern is exposed on the wafer, the wafer is stepped, and the pattern is exposed onto a different part of the wafer, such that the exposure fields are non-overlapping. This process is repeated several times across the wafer. Various characteristics of the exposed patterns are then measured to generate data needed to build the model. One source of error in building a model in this way is that a given characteristic can have different measured values depending on the characteristic's location on the wafer.

Several approaches have been described to reduce the effect of this across-wafer variation. U.S. Pat. No. 6,646,729 to Van der Laan et al. describes a methodology for aberration measurements in which across-wafer variation is circumvented by using a technique referred to as "micro-stepping" or "die-in-die" exposures. In that technique, the same part of the wafer is used so that all exposures are subject to substantially identical errors. Similarly, U.S. Pat. No. 6,130,747 to Nomura et al. describes a micro-stepping methodology in which the exposures needed for an assessment of astigmatism aberration is performed by placing exposures of similar features in close proximity through multiple exposures that are placed in slightly different locations. See also U.S. Pat. No. 6,091,486 to Kirk.

Background of Section II

This invention relates to a method of characterizing lithography projection equipment used in manufacturing of integrated circuits.

Referring to FIG. 1, a conventional optical lithographic scanner system, for image-wise exposure of a coating of resist on a semiconductor wafer, includes an extended light source for emitting a beam of actinic radiation. The illuminator optics project the light from the extended source onto an exposure mask (also called a reticle) that defines a pattern of features that are to be transferred from the mask to the resist coating. Apertures inserted at the extended light source define the angular light distribution of the illuminator. The light passes through the mask, which is shown as having a single opaque element in a transparent field. The projection optics create an image of the mask pattern on the resist coating. Upon exposure to radiation chemical reactions are initiated within the resist that ultimately change the resist solubility in aqueous solutions. In order to complete the reactions initiated during exposure elevated temperatures are required and therefore the wafer is placed on a bakeplate for a certain amount of time. This process step is commonly referred to as post exposure bake. The solubility determines the speed with which resist is removed if covered by an aqueous solution (typically a solution of TMAH in water). The process of removing resist in the areas that have been exposed to light is referred to as resist development. High solubility corresponds to a fast development rate (i.e. removal rate). The solubility change depends in a highly nonlinear, approximately step-like fashion on the radiation dose. There are two categories of dose dependencies. For example there are resists which have very low to negligible development rates at low doses and their development rate increases with increasing dose. Such resists are referred to as positive resists. The inverse relationship, high development rate at low doses and small development rate at large doses, is found in negative resists. Resist thickness is a variable that can easily be measured with existing equipment in the semiconductor manufacturing line. Therefore a common way of representing the dependency of the development process on exposure dose in graphic form is to plot the remaining resist thickness as a function of exposure time given a fixed initial resist thickness and time of development. Even more easily detectable than the resist thickness is the lowest dose at which the resist is completely removed from the wafer. The corresponding dose is referred to as 'dose to clear' ($D_0$). The value of $D_0$ is not a fixed property of the resist, rather it depends on a variety of process parameters, some of which have already been mentioned (resist thickness, develop time). Other parameters are for example the temperature of the post exposure bake, time delay between exposure and bake as well as developer concentration and temperature. These parameter may vary across the wafer and thus lead to across wafer variations of the dose to clear $D_0$. A common cause of such variations is nonuniform temperature distributions across the post exposure bake plate.

After the development process, a pattern of resist features that corresponds to the pattern of opaque features of the exposure mask (in the case of a positive resist) remain on the wafer. This resist pattern may then be transferred into the underlying substrate through various etch processes as areas covered by resist are not subject to the etch erosion.

FIG. 1 provides a schematic overview of an imaging system. Light from an extended light source is projected onto the reticle with the illuminator optics. The pattern created by those areas which block light and those which allow light to pass through the projection optics is imaged onto the resist pattern covering the wafer. The best image characterized by the highest fidelity of the imaged pattern to the original mask pattern exists only for a specific distance between projection optics and wafer and to a lesser degree for a small range around this distance. For other distances other characteristics of the imaging system may determine the pattern formed on the wafer and the pattern may not at all be reminiscent of the pattern on the mask.

The transfer of the complete mask image onto the wafer may be accomplished via one single exposure, in which case the full image area of the mask is uniformly illuminated at once. In this case the dose delivered to the wafer is controlled by opening a shutter for a certain amount of time. Alternatively, only a slit-shaped region of the mask is exposed at a time projecting an equivalent image on the wafer. Image transfer of the full mask image is accomplished through simultaneous, highly coordinated movement of both reticle and wafer stage, a process referred to as scanning. The dose delivered in this case is largely controlled via the speed of this scanning movement. The maximum area of the wafer that can be exposed in a single exposure is referred to herein as the exposure field. The exposure field corresponds to the area of the wafer that would be exposed in the event that the mask were completely clear, and its size and shape are therefore governed by the exposure tool. Generally, the exposure field is rectangular and the exposure tool is used to expose multiple exposure fields that are adjacent each other on a rectangular grid. Thus, to expose an entire wafer, in both imaging approaches once a first exposure field has been exposed the stage is stepped to a new position followed by the next field exposure. In normal operation each field on the wafer is only exposed once, however there are several applications where it is advantageous to expose a field more than once, in most cases with different masks. These techniques are called double exposure techniques. The exposure tool is not limited to exposing exposure fields that are in abutting relationship. For example, the stepping distance along the X or Y axis may exceed the size of the rectangular exposure field, in which case there will be guard strips between adjacent exposure fields, or the stepping distance along either or both axes may be less that the size of the rectangular exposure field, in which case the exposure fields would overlap.

The area of the wafer that is exposed by a bright feature of an exposure mask is referred herein as the image field. A mask may have several discrete bright features, in which case there are, correspondingly, several image fields on the wafer.

For modern lithography systems, controlling the characteristics of the illumination system has become an important parameter in the lithographic process setup. Modern illuminators not only achieve uniform illumination intensity across the mask, but they also provide control over the angular light distribution that impinges on each point of the reticle. Examples of such distributions are shown in FIG. 2, which depicts examples of conventional homogeneous and annular illumination. This figure represents common illumination patterns employed in lithographic systems. For example in conventional homogeneous illumination each point on the reticle field is illuminated with light up to a certain angle of incidence. Therefore if each ray of light passing through the reticle at a given point is drawn, the resulting shape is that of a cone as shown in FIG. 2. In the case of annular illumination, only light within a certain range of angles strikes the reticle. The corresponding representation therefore appears as a double cone. The limiting angles shown in these images are given as ratios referred to as the sigma value. Sigma is defined as the ratio between the sine of the angle on the illuminator and the numerical aperture NA (which in itself is the sine of an angle). The most common way of providing a graphical representation of the actual performance of an illuminator is to use the sine of the angle of incidence and the rotational angle in the plane, to identify a certain direction and plot the intensity delivered by the illuminator in this direction. The resulting graphs are 3D representations of the illuminator performance sometimes also referred to as 'pupilograms' or 'pupil illumination' as it describes the light distribution at the entrance pupil of the projection system in the case that there is no reticle present. This distribution will be referred to as intensity distribution of the illuminator, or illumination distribution for short. Knowledge of this distribution is of great significance as it plays a key role in determining the imaging performance of the projection system.

Given these distributions it is now apparent that a variety of other non-uniformities and non ideal illumination patterns are possible. For example, each one of the directions indicated in FIG. 2 may have different intensities associated with it resulting for example in non-radially symmetric distributions. As another example, the transition at the limiting angle may not be as sharp as implied in the figure and there may be a more gradual transition from zero intensity at some angle larger than the cutoff angle indicated in FIG. 2 to the desired intensity value at some angle smaller than the cutoff angle. Such imperfections lead to variations and non ideal behavior in the imaging performance of an exposure system. For example, asymmetric illumination patterns result in pattern asymmetries as a function of focus. The exact shape of the illuminator distribution also controls other important imaging characteristics such as the difference in resist linewidth between isolated and nested features and line end foreshortening.

Finally all these characteristics may vary from one point on the reticle, or exposure, field to another.

As a result, several techniques have been developed to characterize the illumination system. J. P. Kirk et al. "Pupil Illumination; in situ measurement of partial coherence", Proc. SPIE Vol. 3334, 1998, p. 281-288 describes a technique for recording the illumination distribution. In this technique an obscuration (negative pinhole) is placed on the backside of a reticle. The image of such a feature is formed at a distance far away from the wafer plane. As a result the pattern formed on the wafer is representative of the illumination distribution rather than the shape of the obscuration. Several resist images at a series of exposure doses are recorded in resist and allow a reconstruction of the illumination distribution. Brunner et al., U.S. Pat. No. 6,048,651 discloses a modification of the general methodology using a fresnel zone target as the obscuration.

B. B. McArthur et al., U.S. Pat. No. 6,356,345 "In Situ Source Metrology Instrument and Methodology of Use" discloses a methodology for determining pupil illumination by providing a set of field points in the object plane together with an array of aperture planes at a sufficient distance from the reticle such as to provide an image of the illumination. In one of the best mode implementations the images are also recorded in resist.

Double exposure techniques have been employed in lithography and to some extent in scanner characterization. In particular we refer to the co-pending patent application Ser. No. 10/933,090 filed Sep. 1, 2004. In addition F. Zach et al. "Aberration Analysis using Reconstructed Aerial images of Isolated Contacts on Attenuated Phase shift masks" describe a double exposure method for determining aberrations of an exposure tool. In this publication images of a contact hole are superimposed onto a first, uniform exposure with a dose of less than dose to clear. Based on an analysis of the image intensity in the sidelobe of the main contact image, aberrations can be extracted.

SUMMARY

Summary of Section I:

The present invention is defined by the following claims, and nothing in this section should be taken as a limitation on those claims.

By way of introduction, the preferred embodiments described below provide a method for determining a value of a parameter of an optical proximity correction model. In one embodiment, a first exposure of a mask onto a wafer is performed. The mask comprises a set of features. Next, a second exposure of the mask onto the wafer is performed such that the exposure field of the second exposure partially overlaps the exposure field of the first exposure. A characteristic of the set of features exposed onto the wafer by the first and second exposures is determined, and, based on this characteristic, a value of a parameter of an optical proximity correction model is determined. In another embodiment, an alignment feature is used to align a measurement tool. Other preferred embodiments are provided, and each of the preferred embodiments described herein can be used alone or in combination with one another.

Summary of Section II:

In accordance with one aspect of the preset invention there is provided a method of measuring pupil intensity distribution of an imaging system having an image plane, said method comprising providing a radiation detector, exposing an image field of the detector with a bright feature, positioning the detector at a distance away from the image plane, exposing the image field of the detector with a bright feature, resulting in a cumulative exposure of the image field of the detector from at least the exposing steps b and d, and determining a characteristic of a spatial pattern in the cumulative exposure of the image field of the detector.

In accordance with another aspect of the present invention there is provided a method of measuring pupil intensity distribution of an imaging system having an image plane, said method comprising providing a radiation detector that includes a resist that changes state of coverage upon exposure to radiation with a dose larger than $D_0$, positioning the detector at the image plane of the imaging system, exposing a first region of the detector to a radiation dose DB, wherein DB is less than $D_0$, positioning the detector at a predetermined distance away from the image plane, exposing a second region of the detector to a dose DP of radiation emanating from a bright feature of an exposure mask, wherein the first and second regions of the detector overlap, developing the resist detector, and determining a characteristic of a spatial pattern revealed by step f.

The object of the present invention is to characterize the intensity distribution of the illuminator in a lithographic system.

Preferred embodiments of the present invention provide methods of measuring the intensity distribution of an illuminator. The methodology uses a test mask and a photoresist detector that comprises a positive photoresist film deposited on a wafer.

In one embodiment the method consists of a first exposure where one or more features of the test mask form a reference image on the photoresist detector. On a second exposure, one or more features of the test mask produce an image characteristic of the illuminator. This is accomplished by placing the resist detector out of focus. The reference image provides a spatial reference mark required for the analysis of the illumination pattern.

In another embodiment, the intensity distribution of the illuminator is characterized by combining the exposure of a pinhole imaged in a far out of focus condition with a uniform exposure of an intensity below dose to clear.

With appropriate placement of the test features on the mask the pupil information may be obtained across the exposure field. This information may now be available to modify a layout in a location dependent manner given location dependent pupil information.

The preferred embodiments will now be described with reference to the attached drawings.

BRIEF DESCRIPTION OF THE DRAWINGS

For a better understanding of the invention, and to show how the same may be carried into effect, reference will now be made, by way of example, to the accompanying drawings, in which:

FIGS. 8a, 8b, and 8c illustrate a mask, step pattern, and resulting wafer pattern.

FIGS. 9a, 9b, and 9c illustrate a mask, step pattern, and resulting wafer pattern of a preferred embodiment using micro-stepping.

FIG. 18 shows a preferred embodiment of the invention whereby a reference mark is placed next to the image that represents the illuminator pattern.

DETAILED DESCRIPTION OF THE PRESENTLY PREFERRED EMBODIMENTS

Figure 3:
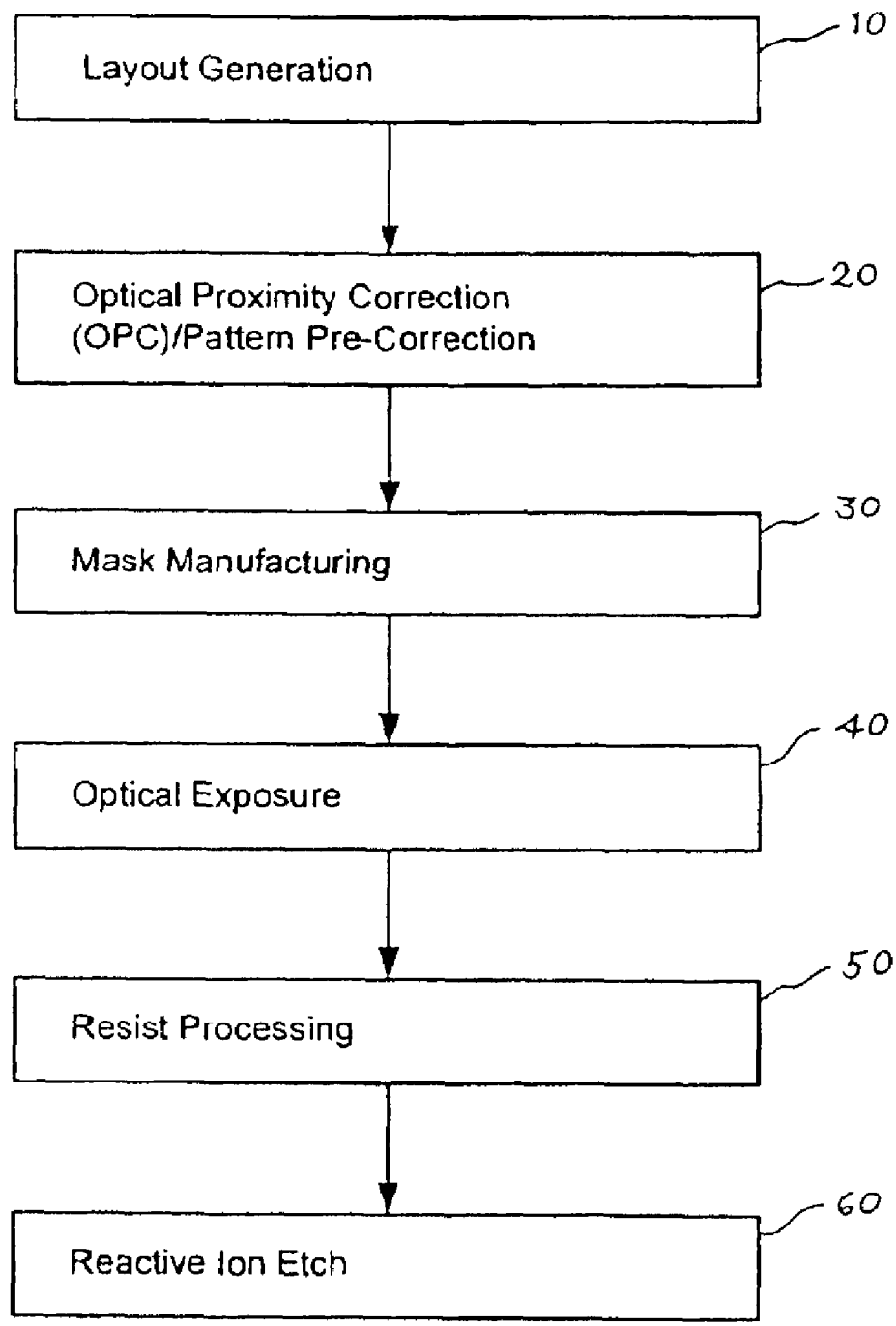
FIG. 3 is a schematic representation of a semiconductor manufacturing process of a preferred embodiment.

Section I: Embodiments Related to a Method and System for Reducing the Impact of Across-Wafer Variations on Critical Dimension Measurements Overview of the Patterning Process The patterning process in semiconductor manufacturing involves a series of steps that are schematically depicted in FIG. 3. These steps comprise layout generation 10, optical proximity correction (OPC)/pattern pre-correction 20, mask manufacturing 30, optical exposure 40, resist processing 50, and reactive ion etch 60. From a patterning perspective, the flow-diagram represents the sequence of transformations and distortion that the initial layout undergoes until it finally appears as an etched pattern in a silicon microchip. Therefore, one may envision each one of the steps in this figure as a series of "black boxes." Each box receives an image as its input and converts it to an output image. The image conversion inside the box is representative of the kind of image transformations and distortions that characterize the process. The ultimate goal of the combined process is to obtain a wafer pattern that is as close as possible to the initial layout. As many of the process steps in between have a tendency to distort or otherwise modify the incoming image, it is preferred that the OPC block 20 be used to compensate for these distortions. Each of these boxes will now be described.

Layout Generation 10

The starting point of the process is layout generation 10. A layout describes, in graphical form, the desired pattern in the final microcircuit. The layout is most commonly an arrangement of shapes such as polygons, rectangles, and sometimes other features such as circles. These patterns are created in layout editors, such as Virtuoso, commercially available from CADENCE. Layout editors are software programs that allow the creation, display, and manipulation of a large number of shapes representing the final layout of the microcircuit. The microelectronic chip is created through multiple patterning steps. Each one of these layers is created using its own exposure, mask, and etch processes. Therefore, the complete manufacturing of the microcircuit involves a series of repetitions of the process described in FIG. 3, each one for a single layer layout. Therefore, the layout file contains many layers. For the sake of simplicity, we assume that only one such layer is present in the layout. In most cases, the description of the shapes, their sizes, locations, and other relevant information is stored in a file that can be held on any convenient storage medium such as disk, hard disk, CD, etc.

OPC 20

The layout, in the form of a file, is then transferred to the OPC block 20, which comprises a software program that reads in the information regarding the shapes present in the layout and modifies the shapes through well-defined software algorithms. These algorithms incorporate a mathematical representation of the image distortions that occur in the subsequent process steps. The ultimate goal of this section is to modify the shapes in a fashion that compensates, as best as possible, the distortions introduced during the subsequent steps to provide a final image (i.e., the output of the last block 60 in FIG. 3) that resembles, as closely as possible, the pattern described in the initial layout. In general, the mathematical representation of the process incorporates a set of adjustable parameters. Therefore, it is quite common to have a "calibration" procedure. Essentially, this involves adjusting the parameters in an iterative loop that compares simulated and measured data until satisfactory agreement between both sets of data has been obtained. This process will be described in more detail below.

Mask Manufacturing 30

The output of the OPC block 20, in most cases, is a file describing the locations, sizes, and other important characteristics of the modified patterns, is then transferred to the mask write tool. Masks are plates most commonly made from fused silica, covered with chrome or, in some cases, other suitable materials. The output of the mask manufacturing block 30 in FIG. 3 is a plate with a pattern etched into chrome. Converting the input file into an etched pattern on a fused silica plate is achieved in a series of manufacturing steps that involve exposing a resist covering the chrome-coated plate with an e-beam (in some cases, this may be a laser light source), heating the resist to a predefined temperature and for a predefined amount of time, developing the pattern on the mask, removing the chrome from the plate in the areas that are not covered by resist (most commonly through reactive ion etching), and, finally, removing the resist from the plate. The spatial pattern distribution of the e-beam exposure is determined through yet another series of software algorithms from the received input file. In this step, distortions between the pattern as received by the mask manufacturer and the final pattern etched into the chrome layer on the mask occur through a variety of mechanisms. For one, the exposure of the resist to an e-beam creates more than the primary, intended exposure dose. Electrons that have penetrated the resist will be heavily scattered in the underlying chrome and fused silica layers with a significant fraction of those scattered electrons returning into the resist layer. The electrons scatter over considerable distances (several micrometers), exposing the resist to a "blurred" background of electrons. This background contributes to variations in linewidth of the mask features depending on the overall pattern density in the surrounding area.

Optical Exposure 40

Figure 4:
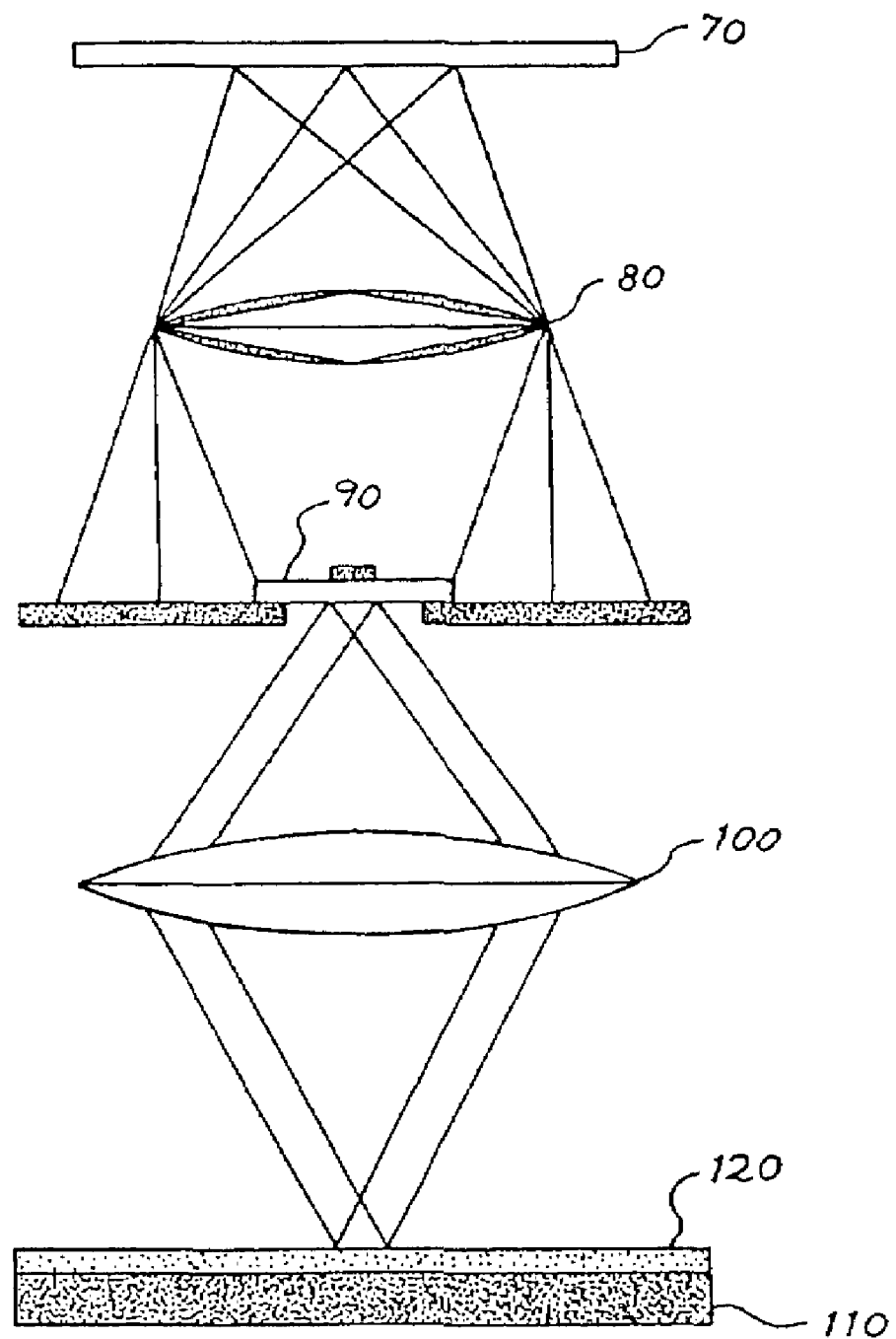
FIG. 4 is a schematic representation of a lithographic exposure tool of a preferred embodiment.

The mask is the primary "template" used to generate the wafer patterns. Through optical exposure tools, the pattern is transferred from the mask onto a wafer. FIG. 4 is a schematic representation of a lithographic exposure tool. For the sake of simplicity, of the many components and subunits of an exposure tool, only the following are shown: an extended light source 70, illuminator optics 80, a mask with a chrome pattern 90, projection optics 100, and a wafer 110 coated with resist 120. The illuminator optics 80 comprise a set of optical elements suitable to uniformly distribute light from the light source 70 onto the exposure mask 90, which is also known as a reticle. The illuminator optics 80 on state-of-the-art exposure tools not only delivers highly-uniform light intensities across the mask 90, they also provides precise control over the angular characteristics of the light impinging on the reticle 90. For example, the angle of incidence can be restricted to within a defined range from a minimum angle of incidence to a maximum angle of incidence. The value for both settings is typically user controllable. This particular illumination pattern is referred to as annular illumination. The limiting case where the largest angle of incidence is 90 degrees is referred to as conventional illumination. More sophisticated illumination patterns not only limit the range of angles of incidence, they also restrict the angle within the plane. Quadrupole- or dipole-illumination are illumination modes that fall in this category. The type of illumination (conventional, annular, quadrupole, dipole, etc.), as well as the parameters of the particular mode chosen, may be selected by the user.

Light that passes through the mask 90 enters the projection optics 100, which then form an image of the mask pattern on the resist coating 120. The best image, described by the highest fidelity between the mask pattern and the pattern imaged on the wafer 110, is achieved only for a specific distance between the wafer 110 and the projection lens 100 and, to a lesser degree, for a limited range around the so-called best-focus condition. Any movement of the wafer 110 away from this position, either closer or away from the projection lens 100, is referred to as defocus. Overall, the output of the optical exposure block 40 is a spatial distribution of light patterns created through the projection optics.

Resist Processing 50

The manufacturing of microelectronic chips is performed using flat disk-shaped pieces of silicon called wafers. For lithographic processes, the wafer is typically coated with at least one, sometimes more, thin polymer layers. Coatings are formed by dispensing a small amount of the polymer dissolved in the appropriate solvent onto the wafer and then rapidly spinning the wafer. The spin process uniformly distributes resist over the wafer. In addition, aided by the rapid movement of the wafer, the solvent evaporates, increasing its viscosity up to the point where the resist is no longer fluid but forms an essentially solid film on the wafer. Even though this process delivers layers of fairly high uniformity, some small variations in the thickness of the polymer layer remain.

At least one of the polymer layers, called the resist layer, is sensitive to light exposure. Upon exposure of the resist to radiation, chemical reactions are initiated that ultimately change the resist solubility in certain aqueous solutions. While the exposure only initiates the initial steps, the chemical reactions require thermal energy to complete. Therefore, the wafer is placed on a bake-plate at an elevated temperature, a step commonly referred to as post-exposure bake. As mentioned above, the chemical reactions resulting in a modified solubility are temperature-dependent, and, therefore, non-uniformities of the temperature distribution across the bake plate lead to small variations in the solubility of the exposed areas.

After the bake process, the wafers are cooled down to room temperature and then covered with an appropriate solution that removes resist from regions with high resist solubility, whereas the resist remains on the wafer in the areas of low solubility. This process is commonly referred to as the development process. The solubility change depends in a highly nonlinear, approximately step-like fashion on the radiation dose. This is a property of great significance, as it avoids the effect that there is a gradual transition in resist thickness between areas where the resist has been completely resolved to areas where the resist solubility is very low. Rather, the most desirable result is a "digital" pattern consisting of areas free of resist and areas where the resist has not been dissolved at all.

There are two categories of dose dependencies. For example, there are resists that have very low to negligible development rates at low doses, and their development rate increases with increasing dose. Such resists are referred to as positive resists. The inverse relationship—high development rate at low doses and small development rate at large doses—is found in negative resists.

The amount of time that the solution remains on the wafer, the temperature of the developer, and, more importantly, the temperature of the wafer, impact the speed with which the resist is dissolved. Therefore, non-uniformities in any one of these parameters across the wafer will impact the exact shape of the patterns formed in the resist. Similarly, bake plate variations impact the solubility of resist and, therefore, again result in variations of the precise shape of the features.

As a result of this process, a pattern in resist can be created, provided the resist can be exposed to a corresponding distribution of bright and dark areas. The sequence of steps between the exposure of the resist to the light created from projecting the mask and the resist pattern revealed after development of the wafer is included in the box labeled "resist processing" 50 in FIG. 3. Distortions in the image occur through a variety of mechanisms that involve, for example, a description of the diffusion processes that occur during the post-exposure bake, as well as modifications that occur during the development process.

Reactive Ion Etch 60

Finally, the pattern, as it is formed in resist, is transferred into the underlying films on the wafer through a process called reactive ion etch (RIE) 60. In this process, the underlying films are removed from the areas that are not covered by resist, mostly through the erosion and chemical reactions induced by the ions. While this process is highly anisotropic in that the erosion progresses preferentially in a vertical direction, there are still a variety of mechanisms that lead to deviations between the appearance of the final pattern relative to that of the resist pattern. Most notably, the erosion process is not entirely anisotropic in that there is a lateral component of the etch process that tends to shrink the width of those features covered by resist. In addition, there is the reverse process, whereby the areas in the final image that were covered with resist grow relative to the size of the resist pattern through a passivation process. This passivation occurs when byproducts of the etch process deposit on the sidewalls of the features to be etched. Through continuous deposition of such passivation layers during the etch process, the width of the non-etched features increases as the process proceeds.

OPC Calibration

This section will return in more detail to the process step labeled OPC 20 in FIG. 3. As mentioned above, this process involves a pre-distortion of the shapes present in the layout, such as to compensate for the distortions that occur in the subsequent process steps. Therefore, the compensation requires a numerical or mathematical description of the type of distortions that occur in each processing segment. Most commonly, a model is used that involves a mathematical model that contains a number of adjustable parameters. For example, in the case of the optical model, adjustable parameters may be the precise shape and angular distributions of light delivered by the illuminator to the reticle. Other adjustable parameters may describe the deviations of the projection optics and its imaging performance from the ideal setting. Some of these parameters are referred to as aberrations. However, it is worthwhile mentioning that aberrations are only a subset of a larger set of parameters describing non-ideal lens performance. The extended set of parameters describe not only the phase deviation, but also the lens absorption as a function of diffraction angle as disclosed, for example, in P. Dirksen et al, Proc. SPIE Vol. 4691 (2002), p. 1392. Non-ideal imaging may be a result of imperfections during the lens manufacturing, less than perfect mounting and orientations of the individual lens elements, or material degradations, to name a few.

For the case of resist modeling, a variety of approaches are used. Some of them are purely empirical modeling based on the so-called variable-threshold model, as described, for example, in N. Cobb et al., Proceedings of the SPIE, vol. 2726 (1996), p. 208. Others models use parameters more anchored in the mechanisms that occur in the resist, for example, diffusion length and contrast of the resist, an example of which is described in T. A. Brunner, SPIE Vol. 2726 (1996), p. 198. These parameters are not a priori known for the process but need to be determined experimentally, a process called "model calibration." The term may sometimes be used more specifically. For example, "resist calibration" would refer to the experiments needed to determine parameters used in the resist model.

Most commonly, the calibration process involves designing a set of test features (also referred to herein as test structures or patterns), placing them on a reticle, exposing the reticle, and processing the wafers through the complete set of processes described in FIG. 3 and then measuring a characteristic of the patterns. The type of patterns selected, the type of exposure conditions used, and the type of characteristics measured on these features essentially control which one of the parameters for each of the modules shown are being determined. For example, a series of line and space patterns where line-widths and space-widths are modified in a specific manner may be used to calibrate the resist model. In many cases, the process involves exposing the test-patterns at a multitude of exposure conditions. For example, in the case of an aberration measurement, a multitude of focus values may be necessary to determine aberrations. Primary interest for applying modified exposure conditions arises from experiments, whereby the characteristics of the exposure tool or the resist process are determined. For example, the characterization of the light distribution in the illuminator requires a set of experiments to be performed at a variety of dose conditions, as outlined in J. P. Kirk et al., "Pupil Illumination; in situ measurement of partial coherence," Proc. SPIE, Vol. 3334, (1998), p. 281-288. In another application, J. Schacht et al., "Calibration of OPC models for multiple focus conditions," Proc. SPIE. Vol. 5377 (2004), p. 691-702, discloses a methodology whereby a variety of focus conditions is used during the calibration of an OPC model. Additional details regarding the usage of various exposure conditions for the calibration of resist models are given in U.S. patent application Ser. No. 10/861,170, filed Jun. 4, 2004, which is assigned to the assignee of the present application and is hereby incorporated by reference.

The calibration process, per se, involves comparing the experimental results with simulated data, evaluating the differences between the two, and then modifying one or several of the model parameters. This process, in most cases, is repeated multiple times until good agreement is achieved between model and experimental data. Even if one does not require several exposure conditions to determine the parameters required in the OPC model, having multiple measurements for a single feature is advantageous in that the measurement noise introduced by the metrology tool may be reduced significantly, resulting in drastic improvements in the quality of the models created.

Unfortunately, other realities of the semiconductor manufacturing process interfere with obtaining reliable experimental data in cases where a variety of exposure conditions are employed. In the most common implementation of the experimental procedure, each exposure field, representing one of the exposure conditions, is placed adjacent to the other exposure field. The transfer of the complete mask image onto the wafer is most commonly achieved by exposing a slit-shaped region of the mask at a time. Image transfer of the full mask image is accomplished through simultaneous, highly-coordinated movement of both reticle and wafer stage, a process referred to as scanning. The maximum area of the wafer that can be exposed in a single exposure is referred to herein as the exposure field. The exposure field corresponds to the area of the wafer that would be exposed in the event that the mask is completely clear, and its size and shape are, therefore, governed by the exposure tool. In general, the exposure field is of rectangular shape, and the most common mode of exposing multiple fields on the wafer is to place them adjacent to each other in a gridlike fashion on the wafer. In normal operation, each field on the wafer is only exposed once and with fixed exposure conditions. Therefore, one would expect that a particular feature, when measured in any one of the exposure fields, gives identical measurement values (within the error of the measurement methodology itself). Unfortunately, in reality, one finds significant variations depending on the location within the wafer where the feature has been placed. A variety of mechanisms contribute to this effect. For example, the temperature distribution on the bake-plates for the post-exposure bake (PEB) process may not be uniform. Non-uniform bake plate temperatures lead to variations in the size of the resist features that occur after develop. Other variations may be introduced by non-uniform temperature distributions at the resist-developer interface as a result of a difference in the temperature of the developer and the wafer. Such variations are superimposed on intended variations and, therefore, lead to errors in the calibration of the OPC models.

As noted above, Van der Laan et al. (U.S. Pat. No. 6,646,729) describes a methodology for aberration measurements, whereby the issue of across-wafer variation is circumvented via "micro-stepped" or "die-in-die" exposures. Similarly, Nomura et al. (U.S. Pat. No. 6,130,747) describes a methodology referred to as micro-stepping whereby the exposures needed for an assessment of astigmatism (one of the aberrations) is performed by placing exposures of similar features in close proximity through multiple exposures that are placed in slightly different locations.

There are additional complications that affect the quality of OPC calibration. Besides across-wafer variation in the measurement data, there are also across-exposure field variations. Across-exposure field variations refer to effects, whereby the distortions of a pattern, induced through one of the processing steps listed in FIG. 3, depend on the location of the pattern within the field. Sources of such variations are, for the most part, caused by field-dependent variations in the mask and optical modules. For example, the mask manufacturing process exhibits across-plate variations similar to those encountered for wafer processing. The across-mask variations of the mask manufacturing process essentially become the across-field variations of the wafer process. Other variations, such as aberrations or slit-position-dependent variations of the illuminator, also contribute to across-field variations. Contrary to the across-wafer variations, across-field effects can be corrected, as quite a few of these effects are systematic in nature. With respect to OPC modeling, this means that one of the parameters that is preferably included for the OPC model calibration is the location of the test structure within the exposure field. As a full assessment of the across-field dependencies preferably takes into account the pattern distributed over the entire exposure fields and, therefore, large exposure fields, the impact of across-wafer variations on OPC model calibrations is further aggravated.

Improved Methodology for OPC Model Calibration

In view of the complications and difficulties involved in obtaining a reliable set of experimental data impacted to the minimum extent possible by across-wafer variations, an improved methodology for OPC model calibration is disclosed. In particular, emphasis is made on the ability of obtaining such data in a field-position dependent manner. The various steps of this improved methodology will now be described.

Providing a Model

The first step in this process is to provide a numerical or mathematical model that represents the pattern modifications that occur during at least one of the patterning processes involved and contains a set of adjustable parameters. Referring to FIG. 3, a series of processing steps is described that comprise the patterning process as it is most commonly exercised in semiconductor fabrication. All together, four process models are depicted representing mask manufacturing 30, optical exposures 40, resist processing 50, and reactive ion etch 60. The sequence also shows the OPC model build 20 as well as the creation of the original layout 10. Besides simply providing a listing of the process steps, this also corresponds to a series of image transformations describing the modifications or distortions of the patterning process. These image transformations are referred to as a model. Models will contain a set of adjustable parameters. The following paragraphs describe examples for such models.

The etch processes used during the mask manufacturing process typically exhibit a radial dependence of the etch rate on the distance from the center of the mask. As a result, the dimension of otherwise identical mask features placed in various locations on the mask differs from one position to another. These distributions may be described in parameterized form, for example:

$$\Delta CD = a \times x^2 + b \times y^2$$

where x and y are the distance of the feature from the center of the reticle in the x and y directions, and delta CD is the change in critical dimension of a feature relative to the same feature dimension when placed in the center of the reticle. In this particular fairly-simple example, the change in critical dimension is independent of other characteristics of the pattern. Even though only a polynomial of $2^{nd}$ order is chosen for this description, higher-order polynomials may be used. The adjustable parameters in this description are the values for a and b, which are determined based on the retrieval of experimental results.

Optical models are fairly well developed in the literature, and the basic theories are detailed in a variety of textbooks, e.g., Bom and Wolf, Principles of Optics, Cambridge University Press, $7^{th}$ edition, 1999. Adaptations of the generic theory to the particular requirements of the lithographic process are described in: N. Cobb, Ph.D. Thesis, University of California, Berkeley and A. Rosenbluth et al., Proceedings of the SPIE Vol. 5377 (2004), p. 615. In the case of ideal lenses and illuminators, the theory does not contain any adjustable parameters. Rather, adjustable parameters are used to describe the deviations in the less-than-ideal imaging performance of the lens or non-ideal illuminator distributions. Examples of such parameters are the wave front deviations, which describe phase change, as well as absorption of light depending on the direction of light propagation through the projection lens. Both phase and transmission changes may impact the imaging performance. The phase changes only are commonly referred to as aberrations. Additional discussion on this topic is provided below in Section II.

Various resist models have been disclosed. For example, in N. Cobb et al., Proceedings of the SPIE, vol. 2726 (1996), p. 208, discloses a resist model termed the variable threshold model, and F. Zach, Proceedings of the SPIE, Vol. 5377 (2004) p. 670 discloses using a neural network for resist modeling. These models take different approaches to describing the pattern distortions created by the resist processes. However, they both have in common the usage of a set of adjustable parameters. For example, in the neural network case, the adjustable parameters are the weights and biases assigned to the individual neurons. For simulation purposes, the algorithms may be most conveniently implemented on a computer.

Creating Test Patterns with a Layout Tool

Next, a set of one or more test patterns/features is created using a layout editor. As used herein, the term "set" refers to a group of one or more than one member. Test-patterns comprise a variety of shapes; most commonly, line and space patterns with a variety of combinations in line width and space width, line end foreshortening structures, contact patterns, or other suitable features. The ease with which a particular model parameter can be extracted from printed wafer results depends heavily on the choice of test patterns. An example of such feature dependencies is the pinhole as disclosed by Dirksen et al. Proc. SPIE Vol. 3679 (1999), p. 77. In this particular case, a phase dot consisting of a bright feature etched into the mask and surrounded by a clear area is exposed. These structures, when printed on the wafer, reveal the presence of aberrations in that the ring-shaped printed features exhibit deviations from a perfect circle that may be used to determine aberration levels. If a sufficiently large area is available, multiple sets of test patterns may be placed in the layout. The individual sets may be of different nature (i.e., there may be patterns for determining the parameters of an optical model, as well as patterns for the evaluation of the resist model placed on the same reticle). In another embodiment, multiple instances of the same test pattern may be placed across the reticle field. In this case, the patterns are used to determine the across-field dependencies of the model parameters. While, in general, the parameters of the resist model are, for the most part, field-position independent, others, such as the optical model or the parameters of the mask model, may exhibit pronounced across-field dependencies.

Surrounding the Test Patterns with a Chrome Frame

The next step in accordance with this preferred embodiment is to surround the test patterns with a chrome frame. While some patterns are, by nature, surrounded by chrome (for example, contact patterns), others, such as line space patterns, may not necessarily be surrounded by chrome. The purpose of the chrome frame is to protect an area surrounding the test pattern from exposure to light. Thus, in a subsequent exposure, this frame may be used to place additional patterns in the same exposure field. In the same fashion, the chrome frame also prevents light from reaching areas that have been exposed during a previous micro-stepped exposure, thus preserving the characteristics of that exposure. As noted above, materials other than chrome may be used to serve the "blocking" function described herein. Accordingly, the use of chrome should not be read into the following claims unless explicitly recited therein.

Figure 5B:
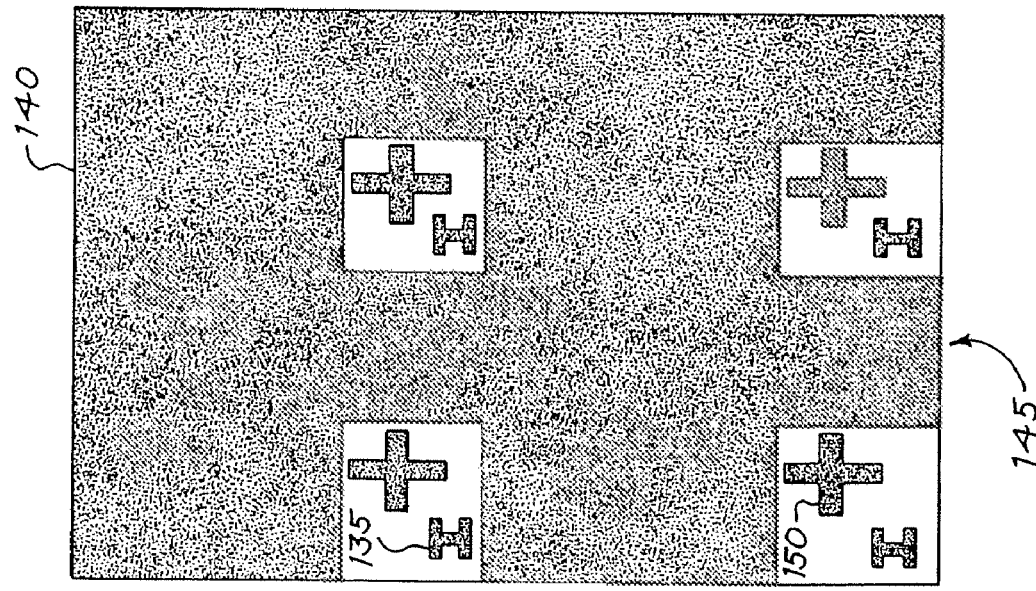
FIG. 5b is an illustration of a mask layout to assess across-field variation of a single pattern with the use of a chrome frame of a preferred embodiment.
Figure 5A:
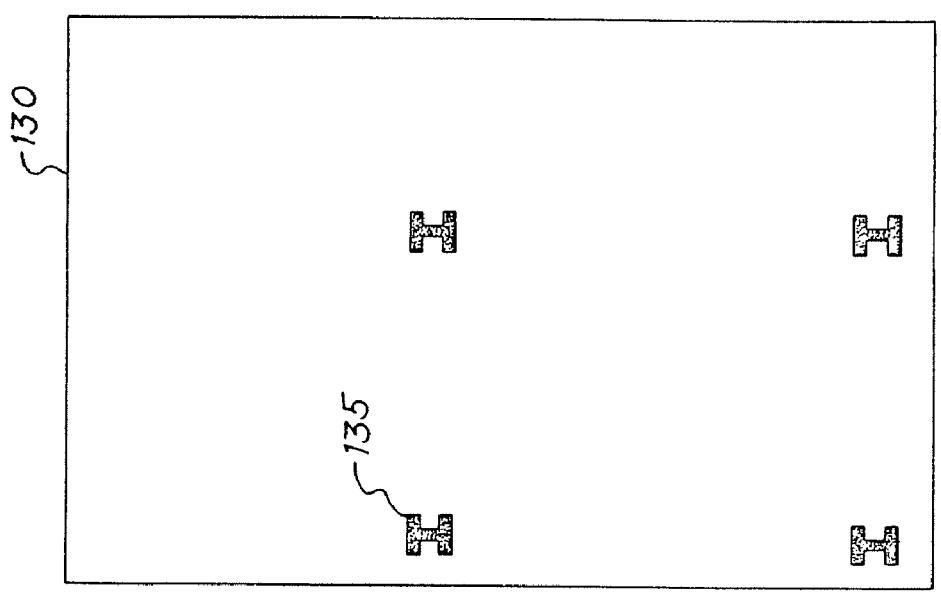
FIG. 5a is an illustration of a mask layout to assess across-field variation of a single pattern without the use of a chrome frame.

For the most part, the differences requirement of the chrome frame leads to fairly characteristic differences in the layout of the mask. In the mask according to this preferred embodiment, the test pattern is concentrated in a few locations surrounded by wide chrome borders, which allow the multitude of micro-step exposures to be placed, as described below with reference to FIGS. 5a and 5b. FIG. 5a schematically depicts a mask layout 130 used to print a test feature 135 (here, an I-shaped dark feature) on a wafer. For the sake of simplicity, only one feature is chosen representative of what may be a multitude of patterns required to perform, for example, a resist calibration. To illustrate the issues associated with performing the experiments in a field-location dependent manner, several (in this particular case, four) instances of the I-bar are placed across the exposure field. FIG. 5b shows a mask layout 140 in accordance with this preferred embodiment. Again, the four I-shaped dark features 135 are located on the mask. However, the features 135 are now embedded in a chrome frame 145. This frame 145 ensures that exposure is blocked from regions that are not used for test patterns 135.

Figure 6:
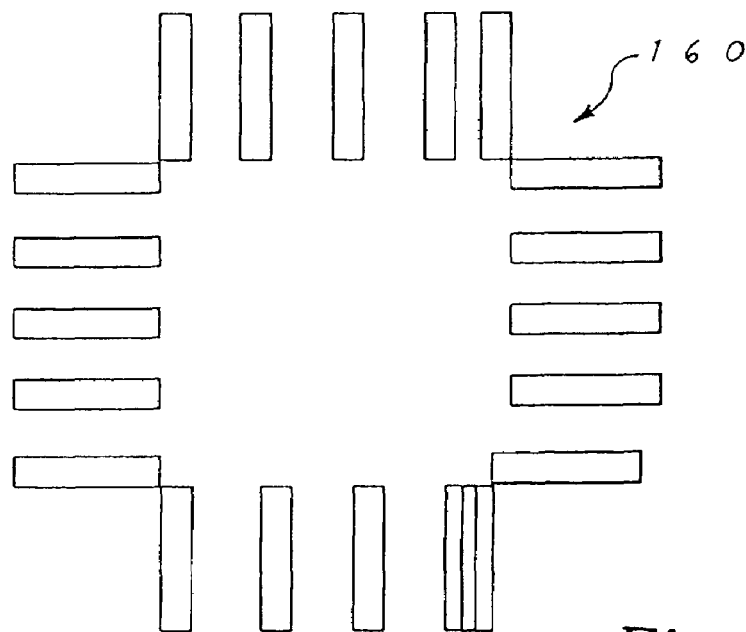
FIG. 6 is an illustration of a pattern recognition and registration target of a preferred embodiment.

In addition to the features of interest 135 (here, the I-bar), the mask 140 in FIG. 5b also comprises an alignment feature 150 (here, a cross-shaped feature). The dimensions of this feature 150 are chosen such that its shape changes as little as possible under different exposure conditions. This is most easily accomplished by choosing a feature size large compared to the wavelength of the light. For example, a cross-shaped pattern with the width of the arms of the order of 1 um provides such a stable pattern recognition target. In its simplest implementation, the feature serves as a target to allow reliable pattern recognition for the measurement tool, a step which is preferably used to perform reliable and automatic metrology. In more sophisticated implementations, the alignment mark may have the shape 160 as indicated in FIG. 6. This mark 160 consists of a sequence of bright bars arranged such as to form a square. This type of pattern recognition target provides advanced capabilities in that it allows the determination of the exact magnification as well as any image shifts and rotations.

Performing the Exposures in a Micro-Stepped Fashion

Figure 7:
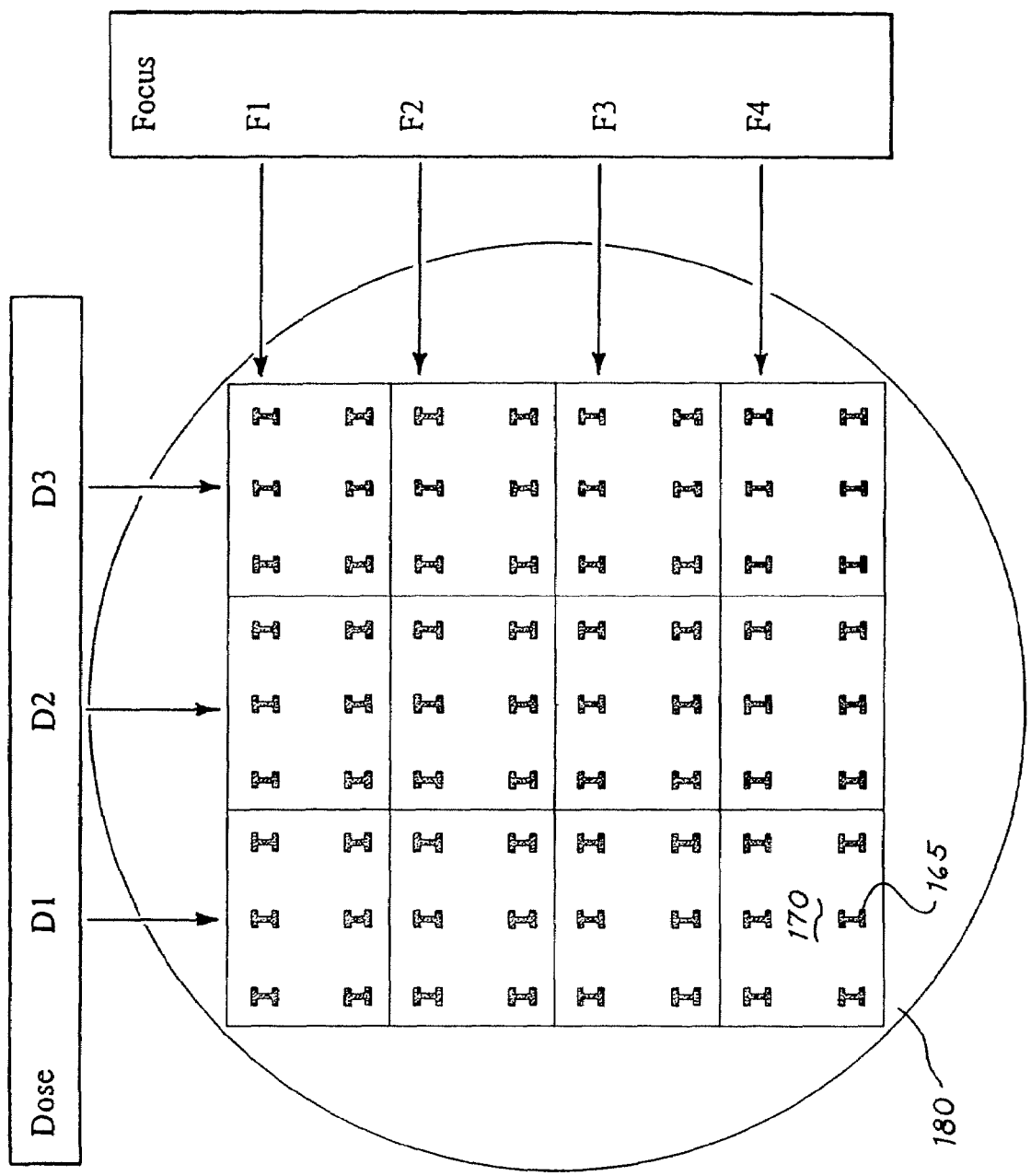
FIG. 7 is an illustration of an exposure approach.
Figure 10:
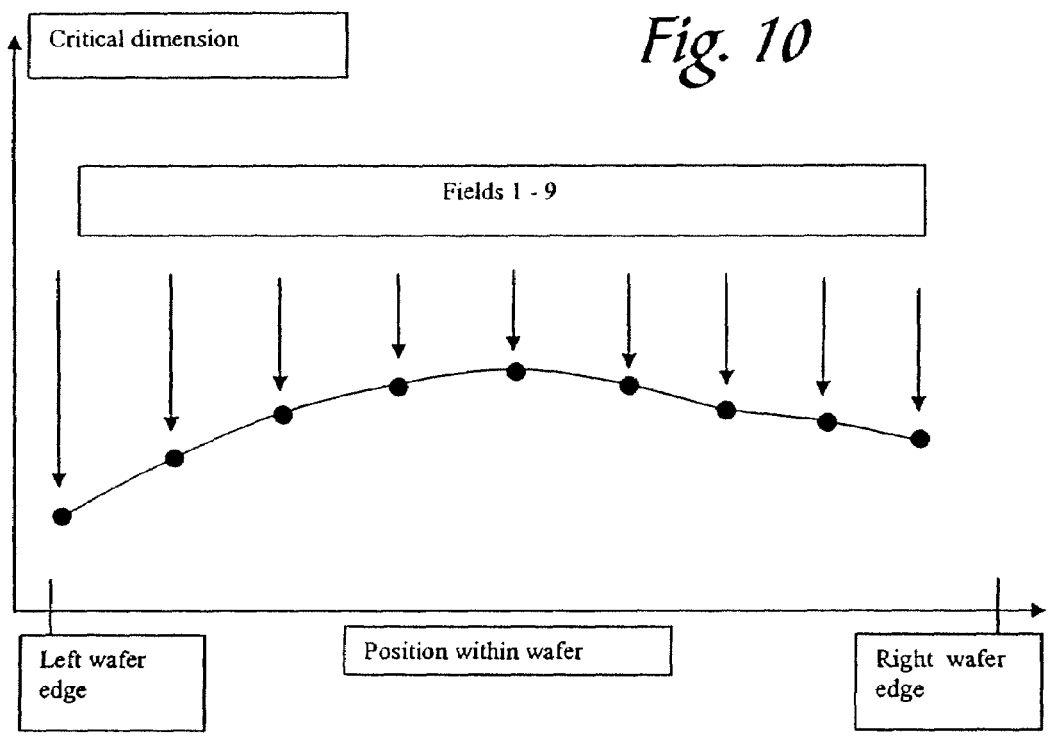
FIG. 10 is an illustration of across-wafer variations.

Next, the modifications to the exposure approach as proposed in this preferred embodiment will be described. Before turning to the modifications, a typical example of an exposure pattern will be provided in conjunction with FIG. 7. As shown in FIG. 7, a multitude of dark features 165 are placed on a bright background within the mask. According to this approach, the wafer 180 is exposed in a regular, grid-like pattern, where the individual exposure fields 170 are placed adjacent to each other and, typically, without any or little overlap.

Each individual field 170 is exposed with one particular set of exposure conditions. As a result of the large field sizes necessary for an evaluation of across-field variations, the multitude of fields placed on the wafer 180 cover a large fraction of the wafer 180. In the most-common exposure mode used for the manufacturing of micro-electronic chips, each individual field 170 is exposed with a single exposure condition characterized, for example, by the defocus distance, exposure dose, and illuminator setting, among others. In a less common exposure mode, which, however, is useful for the characterization of lithographic processes or scanner characteristics, the exposure fields 170 are not exposed with fixed conditions. Rather, a multitude of conditions is applied, one for each exposure field 170. For each field 170, one of the exposure conditions may be changed, for example, doses, focus, or illumination conditions. In the example shown in FIG. 7, dose values for each exposure field are changed in the horizontal axis, and focus values have been changed in the vertical axis.

In this preferred embodiment, rather than using non-overlapping exposures, the individual exposure fields corresponding to, for example, different conditions of dose and focus or other exposure conditions (or the same exposure conditions), are micro-stepped. That is, the wafer and/or mask is shifted by an amount smaller than the width of the chrome frame, such that the exposure field of one exposure partially overlaps an exposure field of another exposure. A comparison of mask layout, field stepping and resulting exposure patterns of a typical approach and that of a micro-stepping approach are shown in FIGS. 8a-8c and 9a-9c, respectively.

FIG. 8a shows a mask pattern 190. The circle 200 shown in the mask pattern 190 is for illustrative purposes only. FIG. 9b illustrates the stepping pattern used in this approach by showing the position of the circle marked on the mask field in the upper left corner of the exposure field. The circles 200 indicate four exposures with a stepping distance comparable to the exposure field size. The resulting pattern 210 is shown in FIG. 8c. The clear areas indicate regions where the resist has been removed, and the dark areas indicate regions where there is remaining resist.

In contrast, FIGS. 9a-9c show the micro-stepped patterns according to this preferred embodiment. FIG. 9a shows that the mask 230 has test patterns surrounded by a chrome frame, and the circles 230 in FIG. 9b show that the mask 230 is stepped with a step-size smaller than the field size. In fact, the step size is preferably compatible with the width of the chrome frame, as the superposition of the dark I-bar onto an area that has been exposed to light in one of the micro-stepped exposures may not result in a discernable pattern. In this example, there is sufficient chrome width to perform one micro-stepped exposure in each direction, resulting in a 2×2 matrix, as shown in FIG. 9c. As noted above, for each one of these exposures, a different exposure condition may be chosen for each individual exposure, or the same exposure conditions can be used for multiple or all of the individual exposures.

Extracting a Characteristic

After processing the layout through a series of patterning processes including mask build, optical exposure, resist processing, and (potentially) reactive ion etch, a characteristic of the pattern is extracted from the modified layout. Examples of characteristics include, but are not limited to, a width of a line, a diameter of a circle, an average radius, and overall shape.

A variety of characterization techniques used for assessing exposure tool or lithographic process characteristics measure the critical dimension of this feature over a range of exposure conditions. In particular, in the context of this preferred embodiment, to calibrate a resist model, i.e., to determine the parameters necessary to perform successful OPC calibration, a variety of dose and focus conditions may be required. Similarly, techniques for determining the parameters of the optical model, for example, wave front distortions, may require multiple focus and dose conditions as well. Lastly, the multiple exposures may find an even simpler usage in that they allow multiple exposures, which help reduce the measurement noise without introducing other complications.

FIGS. 10-13 illustrate the advantages of the micro-stepped exposures over large field characterizations. Even in the case that fixed exposure conditions are used for all fields on the wafer, measurements of the test feature across the wafer typically exhibit variations, such as those depicted in FIG. 10. In this particular example used for illustrative purposes, the variation in measured critical dimension is shown from the left to the right side of the wafer. For the sake of simplicity, it is assumed that only one measurement is taken per field. For fixed exposure conditions, the ideal result is that all measurements have the same value. The variations shown may be created by variations in the thicknesses of the resist and antireflective layer coated on the wafer or variations in the thickness of underlying layers. Non-uniformities in the temperature distribution of the post-exposure bake plates modulate the diffusion lengths of the photoactivated species in the photoresist and, thus, critical dimensions. Yet another source of across-wafer variations may be caused in the development process, for example, by variations in the developer temperature or the effective time of development.

Figure 11:
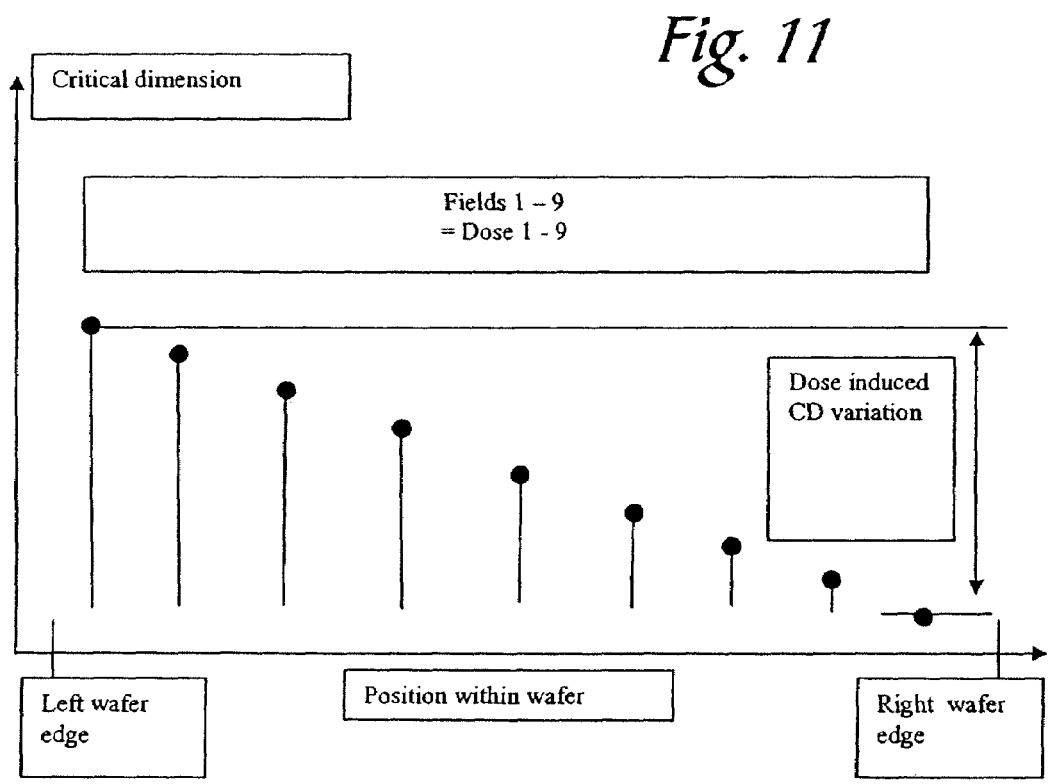
FIG. 11 is an illustration of dose-driven variation in a critical dimension without across-wafer variation.
Figure 12:
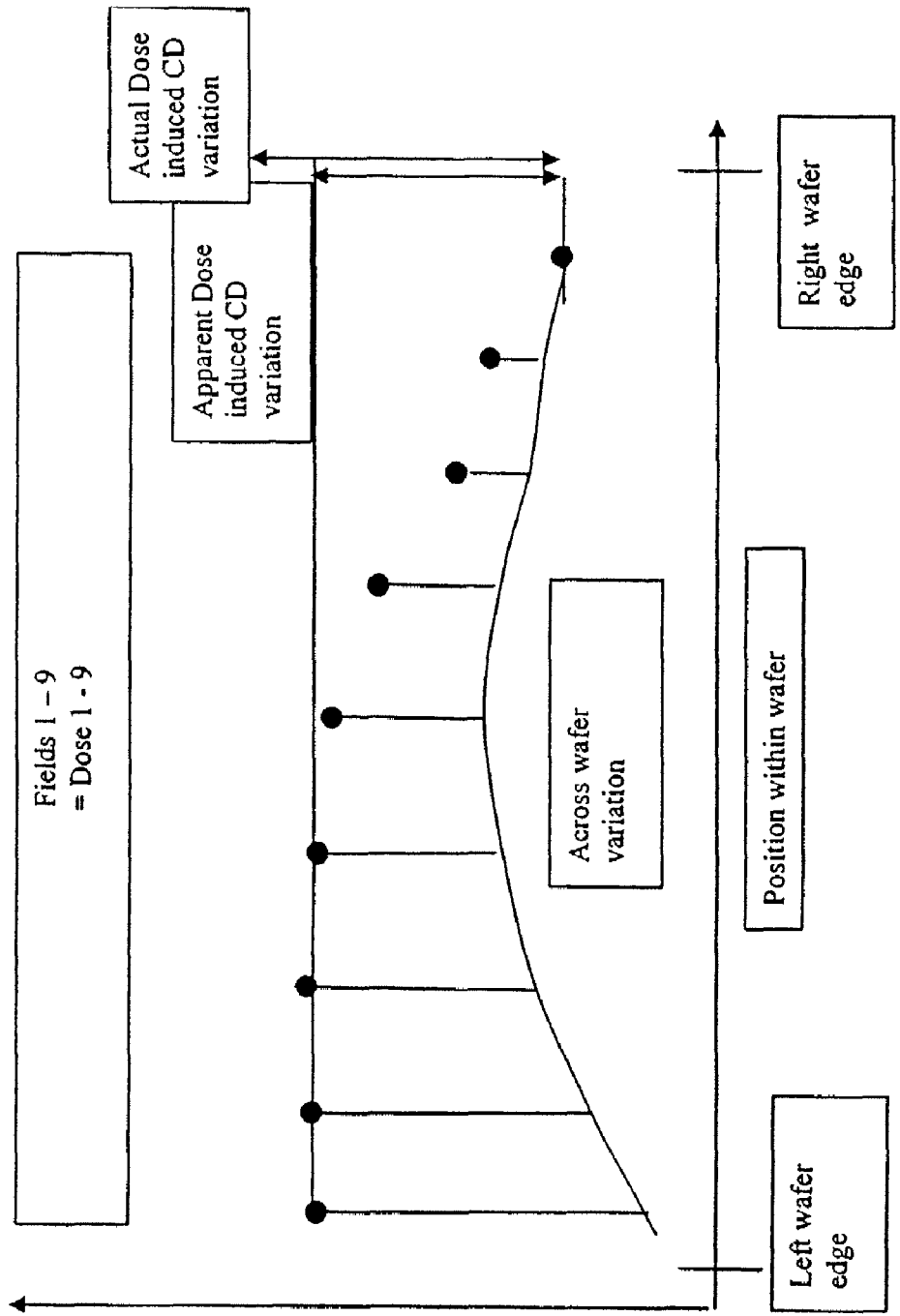
FIG. 12 is an illustration of distortion of measured dose dependency due to wafer-induced variation.

FIGS. 11 and 12 illustrate how these variations impact a proper assessment of the dose-induced changes in critical dimension. FIG. 11 is an example of a dose-induced variation for the critical dimension. With increasing dose (from left to right), the critical dimension of the feature of interest decreases with decreasing dose. As mentioned above, due to the large field sizes, the nine dose values depicted in the example require nine fields, which cover almost the entire diameter of the wafer. As shown in FIG. 12, in the presence of across-wafer variations, this large lateral separation of the measurement locations results in an erroneous assessment not only of the absolute range of the dose-induced critical dimension changes but also in incorrect assessment of the functional dependency of the critical dimension on dose, a characteristic that may be important for the proper extraction of parameters for the creation of OPC process models.

Figure 13:
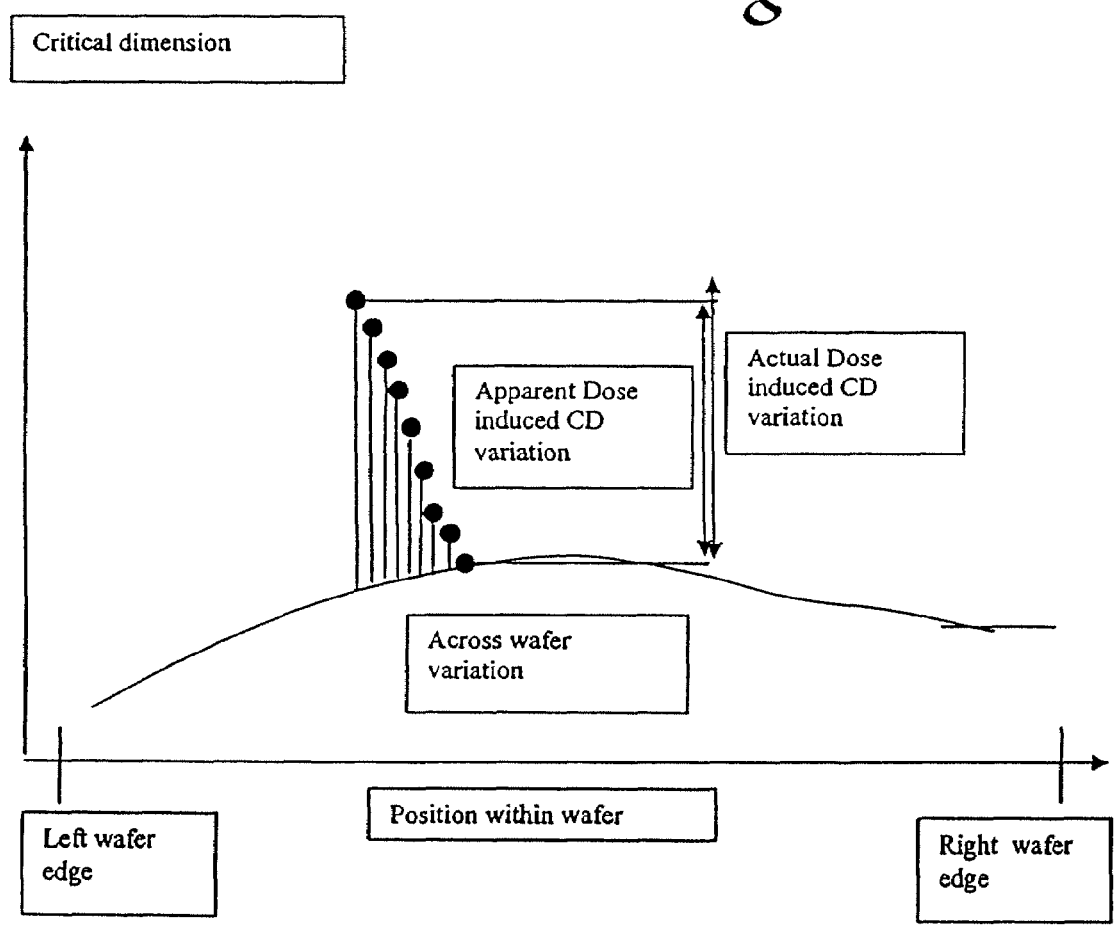
FIG. 13 is an illustration of a reduction of error of a preferred embodiment.
Figure 14:
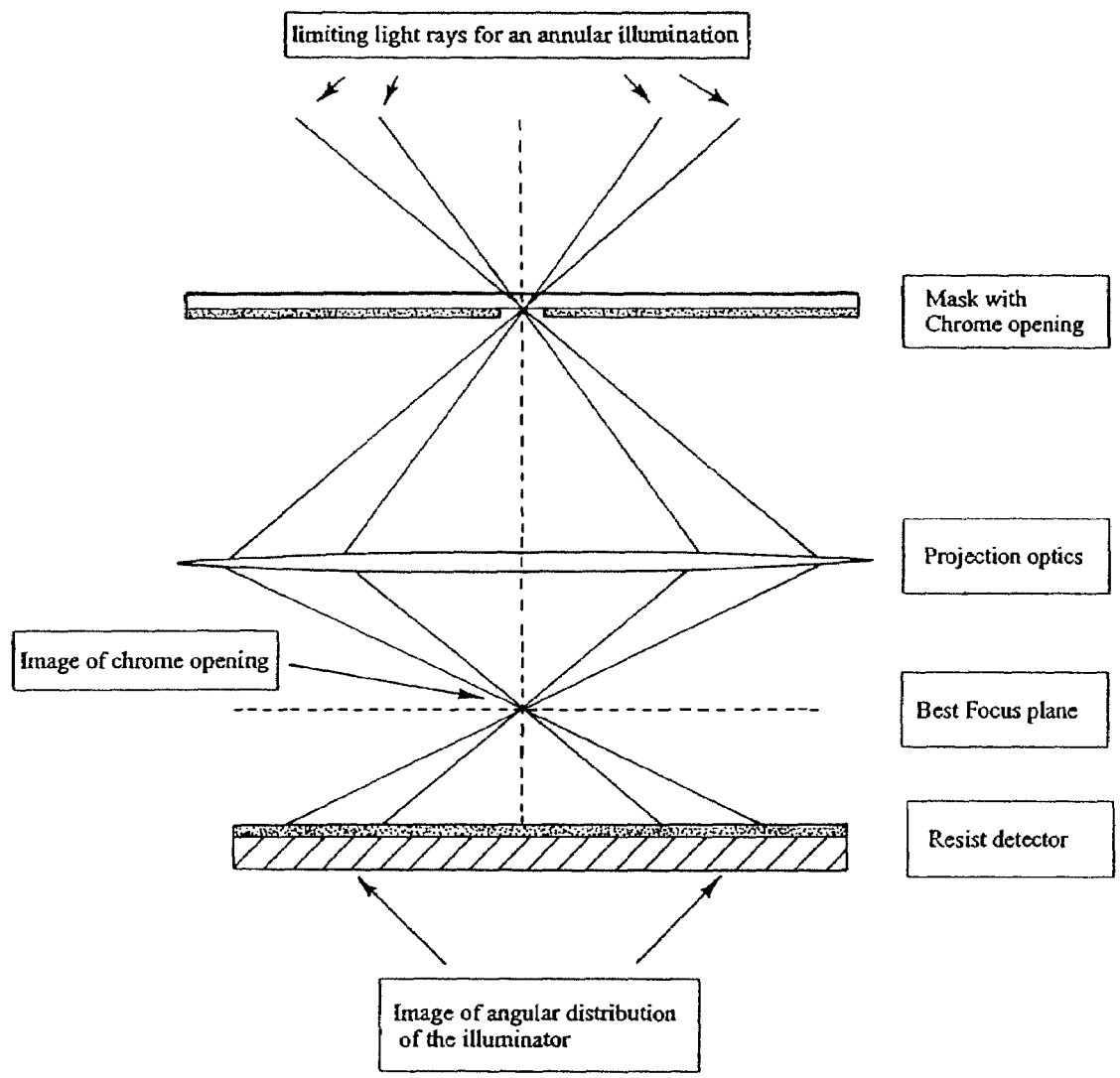
FIG. 14 schematically shows how an image representation of the pupil may be formed through a transparent pattern on the mask imaged at large off focus condition.

FIG. 13 depicts a solution to this issue according to this preferred embodiment. Rather than distributing the individual exposures across the entire wafer, the exposures are placed in a fairly narrow region on the wafer. Thus, the measurement error induced by across-wafer variations on the dose-induced critical dimension changes is minimized.

Once the exposures have been completed and wafers are available, a characterization of the pattern is performed. The type of characterization performed, the patterns investigated, and the exposure conditions selected, as well as the type of measurements selected, determine for which module within the process characterization model the data are the most relevant. For example, in the case of pupil characterization, which contributes to the parameters of the optical module, fairly large-diameter chrome pads (approximate size of several ums) are selected, and the exposures are performed at fairly large defocus values. For calibrations of the resist model, the test patterns investigated may be a series of line and space patterns, structures for characterizing line end foreshortening, or potential contact-like patterns. A resist model calibration may require exposing these features at several values of dose and defocus.

Most commonly, microscopes capable of very high magnifications, such as SEM's, are used to characterize the patterns printed on the wafer, even though optical microscopes may be suitable in some applications where fairly large features (appr. 1 um or larger) are investigated. In some applications, such as the determination of aberrations, imaging capabilities of the microscope are important, as the characteristics of interest are the shape of the features printed. In other instances, it is sufficient to have a single value characterizing the width, length, or diameter of a feature. If the characterization can purely be made based on one-dimensional features, other technologies for pattern characterization, such as scatterometry or electrical linewidth measurements, may be suitable. Most metrology tools require some pattern recognition capabilities that enable the tool to precisely determine the location of the measurement site. As some of the exposures included significant changes in either dose or focus, small features exhibit relatively large pattern changes, which may cause the pattern recognition algorithms to fail. Thus, fully-automated characterization of pattern features over a wide range of exposure conditions may not be possible. In general, the usage of fairly-large targets (of the order of 1 um or larger) provide sufficiently-small pattern changes such as to serve as suitable pattern recognition targets.

OPC Model Calibration

The last step according to this preferred embodiment is the calibration of the OPC model using the experimental data as obtained through the previous steps. The experimental data have been obtained through a series of processing steps represented in FIG. 3. For calibration purposes, the layout as placed on the mask is simulated by processing the layout through the simulation tool encompassing the modules from the flow in FIG. 3. Each one of these modules describes the pattern distortion through a mathematical algorithm that contains a few specific parameters. For simulation purposes, a starting value for each parameter is assumed, and a simulated pattern is created. Experimental data is compared to the simulated results, and then the parameters of the model modified. This process is repeated in an iterative fashion until satisfactory agreement has been achieved between the simulated data and the experimental data. In this way, an iterative algorithm is used, whereby the expected result of the wafer-printing process using the process model is compared to the experimental data obtained through the previous steps, and the adjustable parameters are modified until satisfactory agreement is achieved between the simulated layout and the experimental results. At this point, the model is considered calibrated. As shown in FIG. 3, the simulation flow includes several process modules, each one with their own set of parameters. The choice of patterns modifies the sensitivity of the final printed feature on variations in one of the model parameters. It is this dependency that is being exploited during the calibration process to selectively tune the parameters of an individual module. In an alternate approach, one may simply make an attempt to extract all the parameters simultaneously. In this approach, one does not extract a limited set of model parameters from a set of measurements specifically tuned to maximize the impact of certain model parameters on the printed results. Rather, one attempts to extract all model parameters from all experiments.

It should be noted that the embodiments described above can be implemented in any suitable way using any software and/or hardware. For example, the embodiments described above can be implemented as computer-readable program code embodied in computer-readable media. Also, lithography data that is corrected based on a prediction using any of the computational models described herein can be used to manufacture a device, such as in integrated circuit.

Section II: Embodiments Related to a Method for Characterization of the Illuminator in a Lithographic System Characterization of the Illuminator using a Double Exposure Technique Referring to FIG. 17A, a test structure that may be used to characterize the intensity distribution of an illuminator by a double exposure method embodying the present invention comprises mask 1 that defines a large transparent window 11 and a smaller transparent opening 12 in an opaque field. Mask 1 is typically made by depositing a thin film of chromium on a fused silica plate and then etching the chromium to define window 11 and opening 12.

In a preferred implementation of the invention, the opening 12 is round and is more than one micrometer in diameter. The lower limit on the size of the opening is chosen such as to minimize diffraction effects. Smaller openings (in particular when comparable to the wavelength of the light used to image the opening) are less desirable as they are subject to diffraction effects and these complicate the analysis.

Referring to FIG. 16, two types of exposures are made and superimposed in the same location. This can be achieved by keeping the mask fixed and moving the wafer stage between the first and second exposures by the appropriate amount. In a first step the photoresist detector is exposed using the clear window 11 at a background or primary dose DB below the dose to clear $D_0$. A second exposure with dose DP is then superimposed onto the first one by imaging one of the small openings 12 at a very large out of focus condition. The out of focus condition is chosen such that the resulting image is representative of the intensity distribution of the illuminator.

First the relationship between off focus imaging and its relationship to the characterization of the pupil illumination will be discussed. Subsequently the significance of the first exposure in facilitating the pupil illumination within the constraints of a conventional exposure system is explained. Various embodiments regarding placement of multiple exposures across wafer or across field are described. Next an alternate preferred embodiment whereby the first exposure serves as a reference mark to aid in the analysis of the pupil images is put forth. Again various modifications of the preferred embodiment are discussed where multiple exposures across field, across wafer and at multiple doses are described. The general description will conclude with a section on the extension of this methodology outside of the area of conventional projection lithography.

Reference is now made to FIG. 17 which depicts a mask that may be used for an implementation of one of the preferred embodiments. As is known in the art exposure of the resist detector with one of the mask patterns 12 and the resist detector kept at best focus results in an image on the wafer that essentially resembles the pattern on the mask, in particular if the feature 12 is large compared to the wavelength of light used for imaging.

Figure 1:
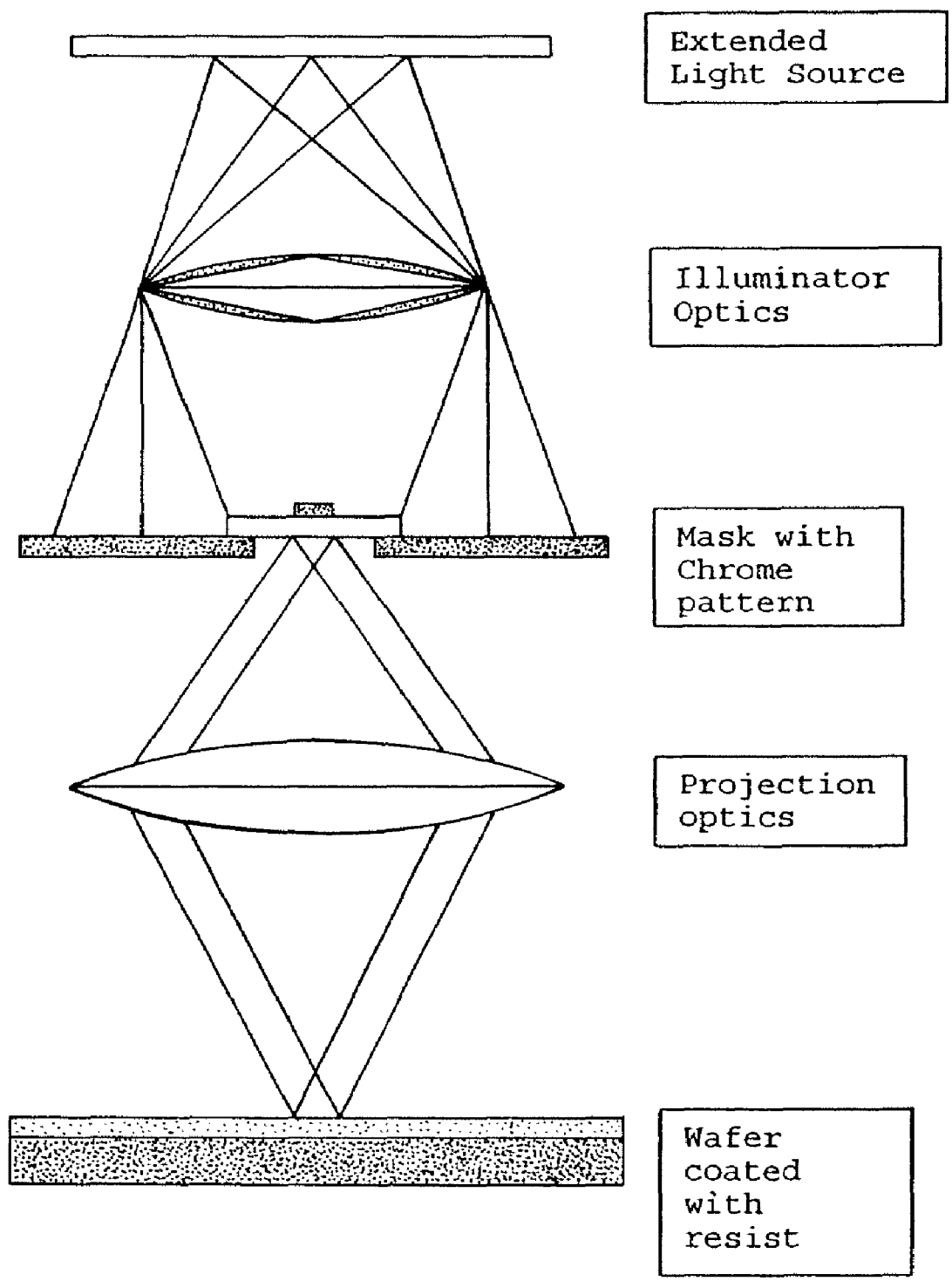
FIG. 1 illustrates the basic components of an exposure system. Radiation emanating from an extended light source passes through the illuminator optics which projects the light onto the mask. The image of the chrome pattern is formed if the mask plane is conjugate to the wafer plane (a condition called 'in focus').
Figure 2:
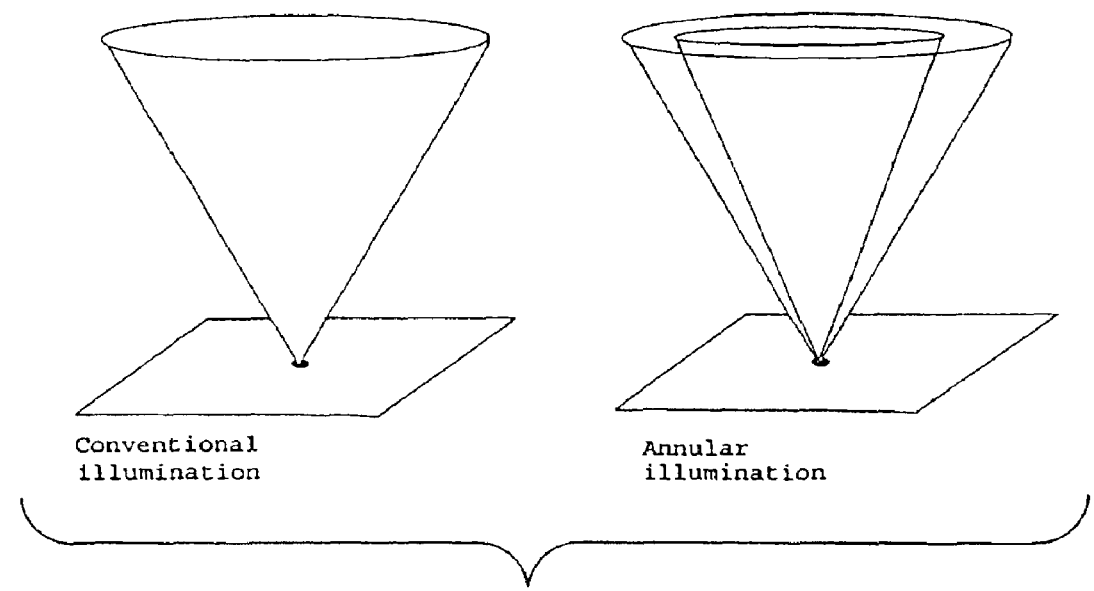
FIG. 2 illustrates the angular distribution of light impinging on a single point in the mask for a conventional illumination pattern and an annular illumination pattern.
Figure 15:
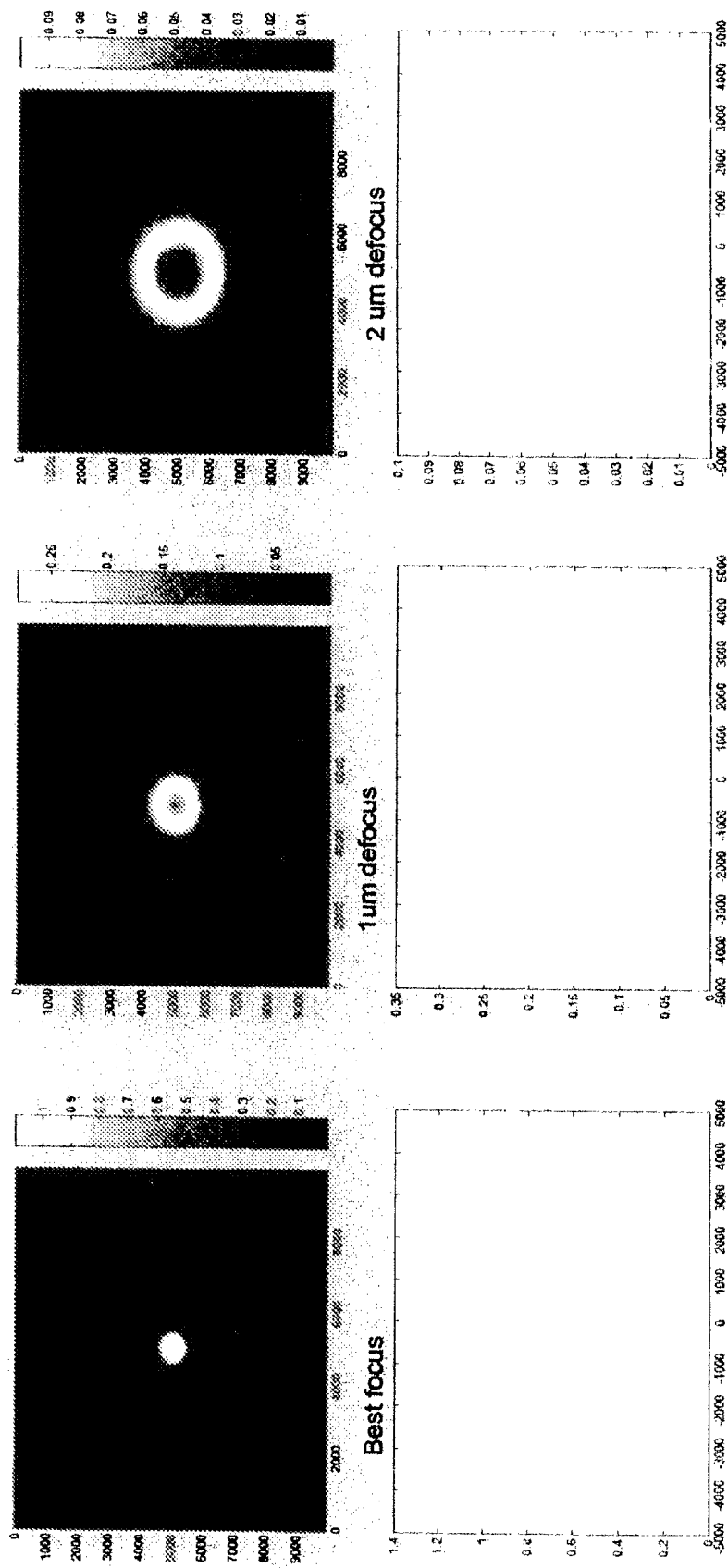
FIG. 15 shows images created by a pinhole at increasing distance of the resist detector to the best imaging condition (i.e. in focus condition). The images show how with increasing defocus the wafer pattern increasingly resembles the pupil illumination.

Referring now to FIG. 15, the significance of the off-focus imaging for obtaining images representing the illuminator distribution is explained. FIG. 15 is created using simulated wafer images, a technique well established in the art. We assume an imaging system as schematically depicted in FIG. 1 and an illuminator pattern as shown on the right side of FIG. 2, namely annular illumination. The simulations have been performed for an exposure tool using light at 193 nm, a numerical aperture of 0.75 and annular illumination with 0.5 inner sigma and 0.85 outer sigma. The top row of images shows the aerial image distributions in a grayscale representation as they appear on the wafer. The bottom row represents a series of graphs where the intensity for a cutline through the center of the images above is plotted. The parameter that is varied in moving from the left through the middle to the right graph is the defocus distance. The leftmost image is for best focus (defocus=0). As mentioned above the image at this defocus distance is essentially identical to the mask image (a 1 um circular feature). With increasing defocus distance, we observe the formation of an annulus reminiscent of the illumination pattern used. The sequence highlights the fact that as the defocus amount (i.e. the amount by which the wafer is moved away from the best image plane) increases, the aerial image changes from the image of the opening on the mask (in this case a 1 um opening) at best focus to an image determined by the intensity distribution of the illuminator. However at the same time the relative intensity drops dramatically as the defocus distance decreases. In a single exposure approach very high exposure doses $D_p$ (i.e. several 100 mJ/cm^2) for the exposure of the transparent mask opening 12 in FIG. 17 are necessary to reach $D_0$. A preferable off focus distance is approximately 3 to 5 times the diameter of the chrome opening 12. At this off focus condition the image is fairly representative of the illuminator while at the same time still maintains reasonable modulation.

While the discussion so far has mostly focused on the aerial image distributions which are of continuous nature the property that is observed on the wafer is that of a resist pattern. To that extent the resist detector, once exposed is processed through a post exposure bake step and developed to reveal the pattern. These processes may be performed according to techniques known in the field of resist processing.

The exposed and developed wafer reveals a pattern determined by the light distributions that were incident on the resist.

Figure 16A:
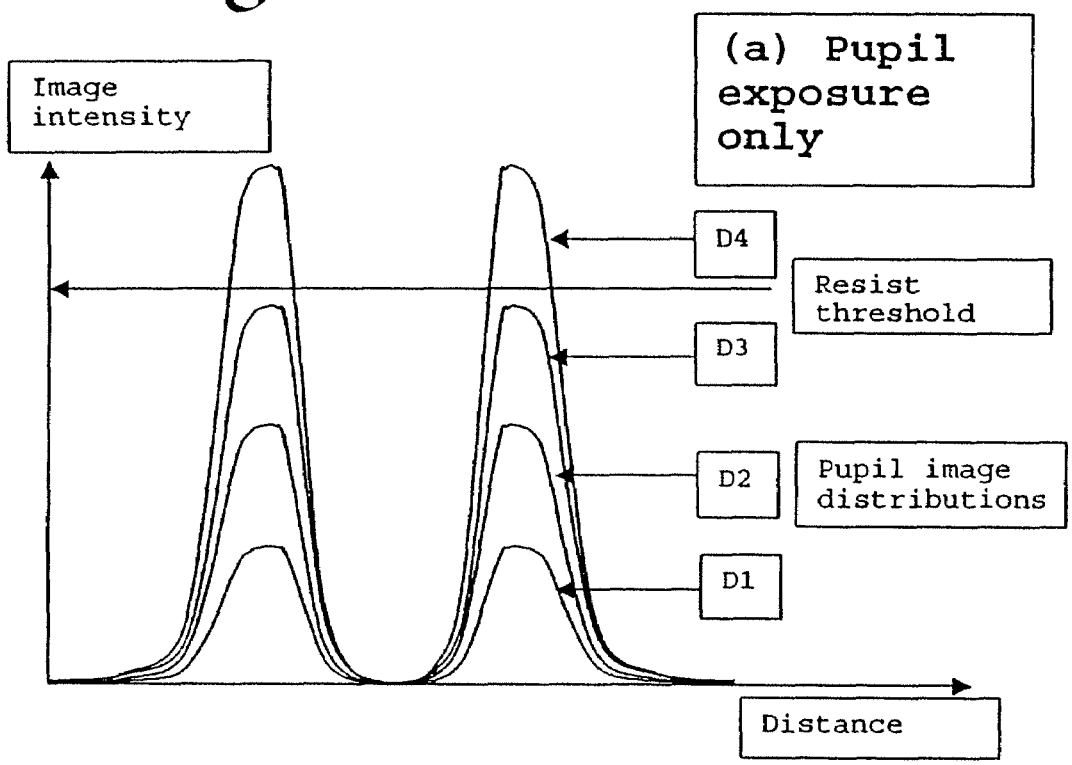
FIGS. 16A, 16B and 16C show the principle of the double exposure technique. The illuminator image is superimposed on a uniform exposure background thereby reducing the amount of light exposure dose necessary to reach the resist threshold.

For a given exposure dose a contour will be formed in the resist separating areas that still remain covered by resist from those where the resist has been cleared. FIG. 16a shows a conventional, single exposure approach. Image intensities in the pupil distribution image are low due to the defocus conditions required. In order to form a pattern in resist any part of the image intensities for doses D1 through D4 must lie above the resist threshold. For the particular example shown only dose D4 is sufficient to raise a part of the image intensity above the resist threshold and therefore a pattern is formed in the resist. In those locations where the image intensities are above the threshold the resist is cleared and thus a discernable pattern formed. It is quite common that the exposure doses comparable to the dose D4 in the example are close to or above the dose limits that can be delivered in a single exposure approach on common lithographic tools. Therefore an alternate approach is desirable.

Figure 16B:
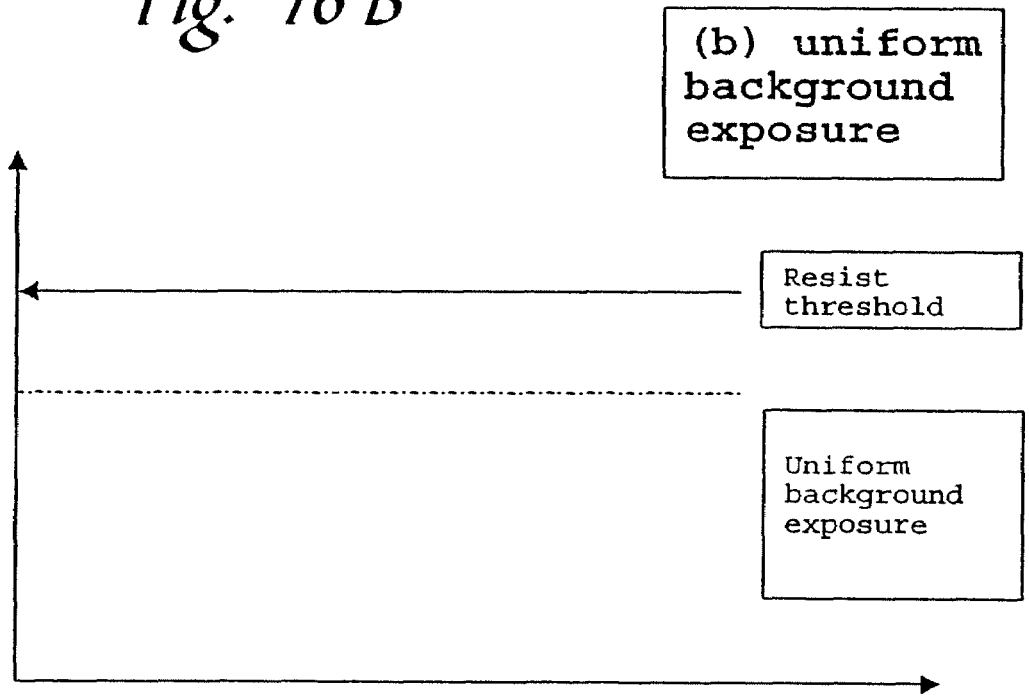
Figure 16C:
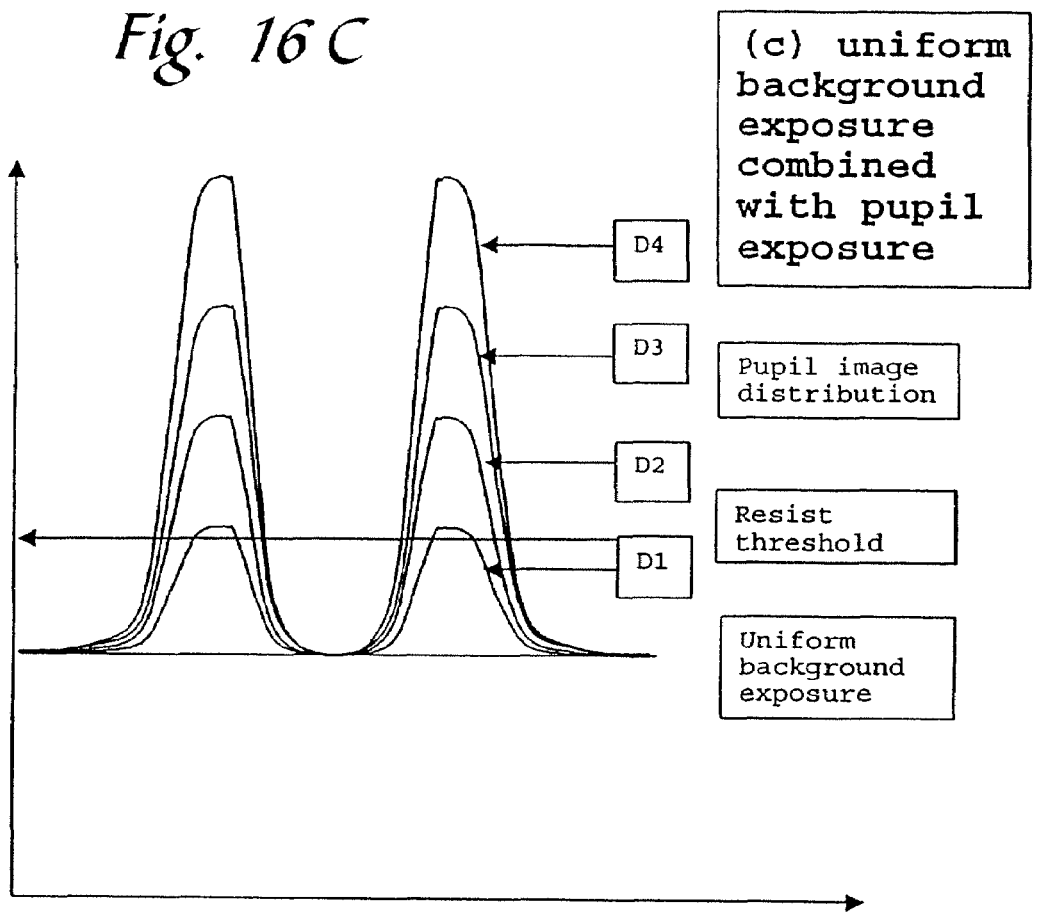

FIGS. 16b and 16c exemplify a preferred embodiment of this invention. FIG. 16b shows the situation after a first, below threshold, uniform dose DB has been delivered. In this case a background intensity has been delivered to the resist. After the second exposure the combined intensity (for the purpose of illustration the same set of doses from FIG. 16a for the second exposure has been used) now allows to observe resist patterns for all four doses DP1 . . . DP4.

These findings can be formulated in a more quantitative fashion. The boundary separating areas where the resist cleared from those where resist remains (in the case of a positive resist) is defined by the condition that the combined dose of background exposure DB and defocused exposure DP of opening 12 is equal to dose to clear $D_0$. Locations where the combined dose is higher will be completely clear of resist, regions where the combined dose is smaller will remain covered with resist. The boundary is defined by:

$$DP*\text{illum}(x,y)+DB=D_0 \quad (1)$$

Where DP is the dose used for the off focus exposure, illum(x,y) is the normalized image intensity distribution created by the illuminator in off focus condition and DB the background exposure dose. It should be noted that illum(x,y) is not identical to the intensity distribution of the illuminator but may be calculated from such distributions through simulation techniques as known in the art.

Re-arranging Equation (1) as:

$$DP=(D_0-DB)/\text{illum}(x,y) \quad (2)$$

shows that the secondary exposure dose DP that is needed to measure the pupil distribution is significantly reduced as the primary exposure dose $DB_1$ approaches the dose to clear $D_0$ from below. The double exposure method of the present invention reduces the exposure time required to characterize the illuminator distribution as compared to the prior art.

Equation (1) shows that the value of the function illum(x,y) is known at the edge of the developed resist and therefore precise knowledge of the location of this edge is desirable. The boundary can be detected using a variety of techniques including optical microscopy, scanning optical microscopy, atomic force microscopy or SEM microscopy. A preferable implementation is the use of a dark-field optical microscope due to its speed, ease of use and the fact that it produces high contrast images at the resist edge.

The primary goal for reconstructing the illuminator intensity distribution is to derive the function illum(x,y) from a set of contours determined by equation (1). This requires that multiple contours created at multiple doses DB or DP be obtained. Measuring the position of the resist edge for multiple values of the primary exposure dose DB enables mapping out the contour levels of the function illum(x,y). This may be accomplished in two separate ways. In one embodiment the uniform background exposure DB remains constant and a set of contours is obtained by changing the dose DP of the off focus exposure. Alternatively the dose DP may remain constant and the set of contours is retrieved by varying the uniform background exposure DB. Finally it should be mentioned that a combination of both techniques may also be applied.

Referring again to FIG. 17, the set of exposures described above may be accomplished in various ways. In one embodiment, the clear feature 11 is used to expose the resist detector at multiple locations across the resist detector. A different dose DBi (1 ... i ... n) is chosen for each exposure. The different locations may be in different exposure fields of the resist detector, such that after each exposure, the wafer stage is stepped to another location on the rectangular grid and another exposure field, adjacent the previous exposure field, is exposed. Alternatively, two or more exposures may be made in the same exposure field of the resist detector at different respective doses. These exposures establish a set of exposure doses DB as defined in equation 1. The pupil generating feature 12 is used to expose the resist detector with a fixed dose DP within the image field defined by mask feature 11 for each of the locations of feature 11. In this manner, multiple image contours are provided, depending on the cumulative exposure dose due to the different background doses Dbi and the uniform pupil dose DP.

In a variation of the process described above, multiple instances 12$i$ (i=1, 2, 3) of the pupil generating feature 12 (see FIG. 17B) are used to expose the detector at a dose DP within the image field defined by the previous exposure of feature 11. This modification allows variations of the pupil illumination as a function of field position to be evaluated. The field position in this case is defined by the location of the mask features 12.

Figure 17A:
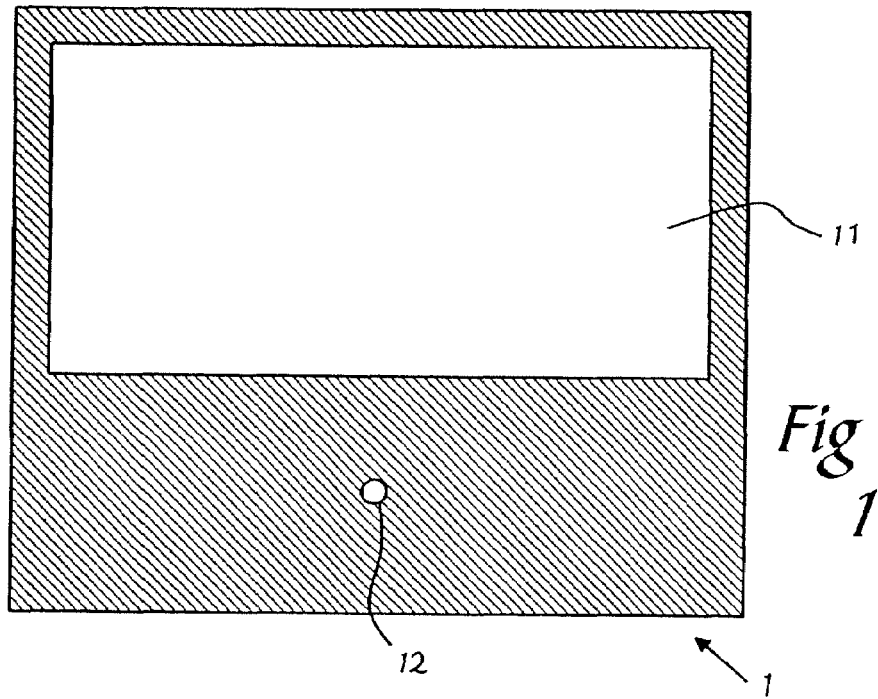
FIGS. 17A, 17B and 17C show various configurations of a mask that may be used in preferred embodiments of the invention.
Figure 17B:
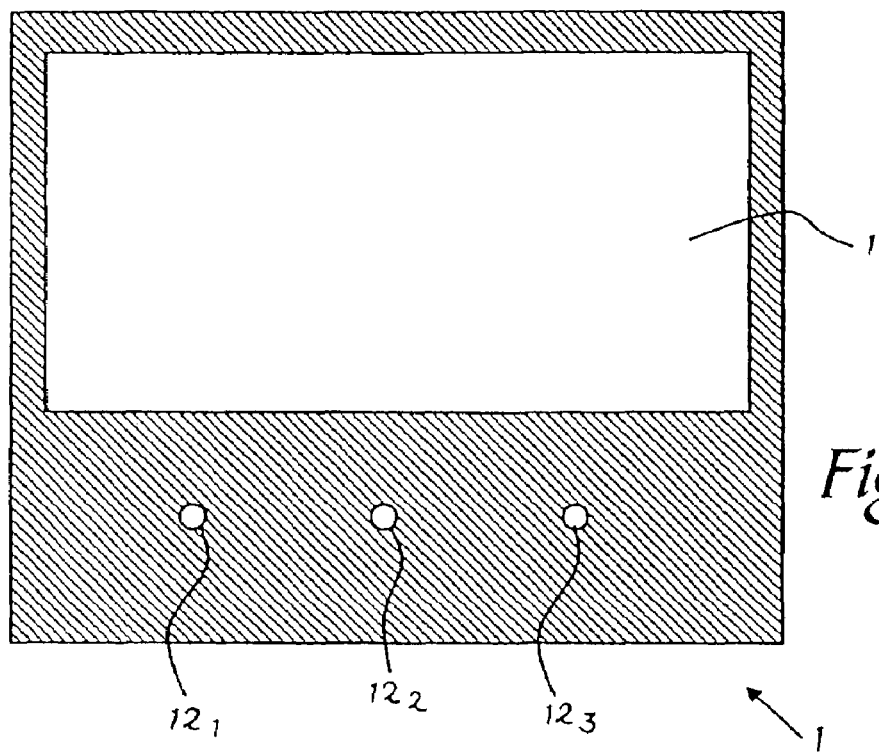
Figure 17C:
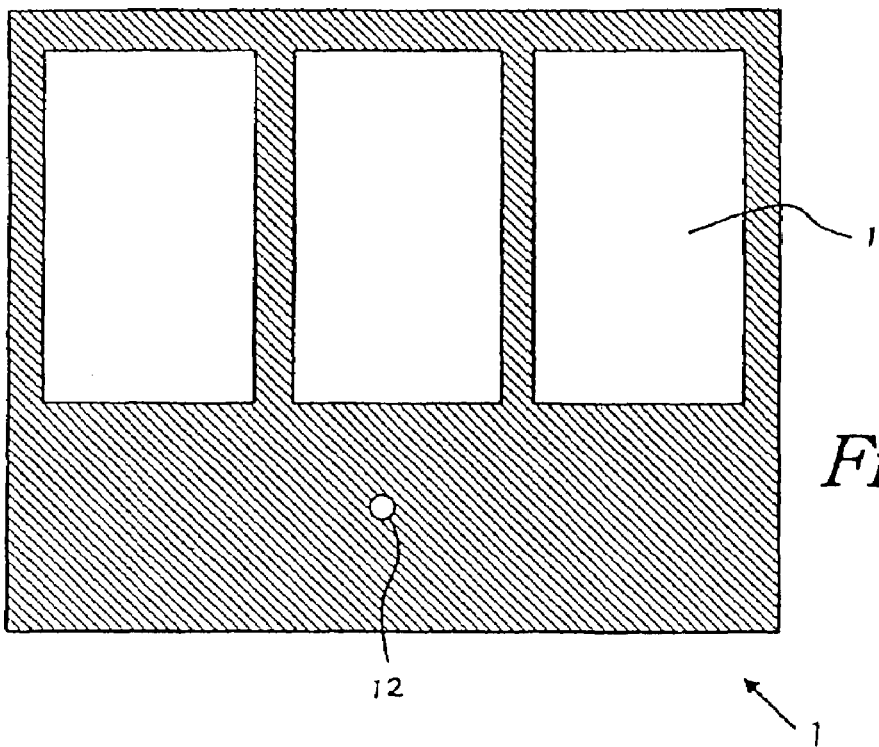

One of the complications arising from placement of the fields 11 across the resist detector is the fact that the value of $D_0$ may vary across the wafer thus significantly increasing the complexity of the data analysis. This problem can be alleviated through an alternate implementation whereby the spacing between locations of different doses DBi is minimized as described below. In the case of FIG. 17A, the mask includes only one large transparent feature. The mask feature 11 however may be broken up into smaller elements (for example by leaving strips of chrome oriented vertically across the clear opening of feature 11, as shown in FIG. 17C. In this case exposures of the individual elements of feature 11 may be performed by selecting each element using the blading or shuttering capabilities available on most lithography tools. In this case image fields of a multitude of elements 11$i$ may be placed within the exposure field with each one of image fields exposed at a different dose. The pupil generating feature 12 is used to expose the detector within the image fields of elements 11$i$ respectively. As in the case of FIG. 17A, the pupil generating feature 12 may be exposed in each case at the same dose DP, or different doses DPi may be used for the elements 11$i$ respectively. In a further development, multiple pupil generating exposures may be performed at different respective doses in the image field of each element 11$i$.

Once the image of the illuminator distribution illu(x,y) has been obtained as a series of contours, various approaches may be possible to reconstruct the intensity distribution of the illuminator. An iterative procedure whereby a certain illuminator illumination distribution is assumed and the expected wafer image is calculated and compared to the observed wafer images may be used. The illuminator distribution is then modified and the process repeated until satisfactory agreement between simulated and experimentally observed distributions is achieved.

So far we have assumed that the exposures of the second bright feature are performed at a fixed value of defocus. Closer analysis of the behavior of the distribution illum(x,y) as a function of defocus reveals that additional information useful for the data analysis can be extracted from the dependence of this function on the defocus value. For example, in the case of conventional illumination, tracing the intensity of illum(x,y) in the center of the distribution (x=0, y=0) as a function of defocus reveals a behavior distinctly different from that observed for annular illumination. This difference can be used to facilitate the data analysis.

One of the issues encountered during the data analysis of pupil distributions is the fact that the individual contours need to be superimposed onto each other. To perform this superposition correctly, knowledge of the absolute location of at least one of the points in the image is required. This point then serves as a reference which allows correct superposition. The contours formed in resist may be measured by a variety of techniques as mentioned above. A preferred implementation is the use of dark field microscopy. When capturing the individual image contours, for example in an optical microscope, the stage needs to move from one location to another one and the accuracy of this positioning in most cases is not sufficient to allow proper overlay of the image contours. Having a reference mark in the image circumvents this issue. Capturing the position of the reference mark provides an absolute coordinate for the image captured. Superposition of the pupil images can then simply proceed by ensuring that the reference mark is in the same position in all cases.

Referring to FIG. 18, a suitable reference mark is created by a first exposure of a bright feature on the mask with a dose larger than $D_0$. For this exposure the wafer detector is placed in the image plane (i.e. in focus). The wafer detector is then moved both laterally and away from the image plane through movement of the wafer stage and the bright feature on the mask is exposed a second time. Through this off focus placement the image is representative of the illuminator as pointed out in the above discussion. Accordingly, in this development of the invention, after exposure of the detector with the feature 11, the detector is exposed using the feature 12 while the detector is still at the image plane. Then, the detector is moved laterally for the out of focus exposure of feature 12. The left side of FIG. 18 shows schematically the images formed when the out of focus exposure is at a first dose DP1 and the right side of FIG. 18 shows the images when the out of focus exposure is at a second dose DP2, which is less than DP1.

The reference mark is preferably printed at best focus since it then exhibits the minimum lateral shift that may be caused by illuminator misalignment. Larger defocus values are possible but they degrade the ease with which the reference mark can be detected and may also be subject to illuminator induced shifts. Using one reference mark allows us to correct for uniform x-y shifts in the images which is the primary contributor to the positional error. Additional marks or reference structures may be used to correct other positional inaccuracies such as image rotation. In this case the best implementation of the measurement is to use separate bright features for the pupil and the reference mark.

As with the previous preferred embodiment there are a variety of options with respect to the placement of multiple features both across the resist detector (a resist coated wafer) or within the exposure field. In one case multiple instances of the pupil generating pattern 12 may be placed across the image field of feature 11. This type of arrangement allows us to evaluate illuminator distributions in a field location dependent manner. The sequence of dose values necessary to provide a series of contours may be placed across the resist detector. This placement may be performed in a standard fashion where the exposure fields are placed adjacent to each other on a regular chip pattern as is commonly used in the art. The different exposure doses may also be 'microstepped'. This is a process whereby the exposure fields corresponding to the different doses are not placed adjacent to each other, in non-overlapping relationship, but are shifted by an amount smaller than the size of the field, and in its most useful implementation significantly smaller than the field size, and therefore overlap. A stepsize that could be employed in this embodiment is of the order of 10 um to 1000 um.

Deviations in the illuminator distribution from the ideal shape result in difficulties appropriately modeling the imaging process for example in OPC applications. They may also be an indication of degradation or faulty operation of the exposure tool and can be used to drive corrective action. If they occur across the exposure field they contribute to variations in critical dimensions (CD) across the field. Consequently, the features of the mask are not accurately transferred to the wafer. The techniques described above for measuring illuminator distributions can be used in optical proximity correction (OPC) to reduce variations in CD across the image field and thereby improve image fidelity.

As pointed out in the sections above the characterization of the illuminator distributions may be repeated at a variety of field locations. For example, the field locations can be spaced 2 mm apart along the long dimension of the slit of the stepper-scanner lens. By characterizing the illuminator distribution for a multitude of field points we obtain information that may be used to perform location dependent proximity corrections following methodologies as disclosed in U.S. Patent Application No. 10/(Assignee reference invarium ID-015, IA-008), the entire disclosure of which is hereby incorporated by reference herein for all purposes.

It should be noted that the sequence of exposures may be reversed and the time between the two exposures may vary.

The techniques that have been described herein for measuring or characterizing illuminator distributions are not limited to a particular lithography technique and are thus applicable to projection lithography in general.

The actinic radiation may be electromagnetic radiation, such as visible light, UV, EUV, or X-ray radiation, or a particle beam such as an electron beam. The nature of the resist depends on the nature of the actinic radiation, e.g. an electron-beam resist is used in the case of an electron beam imaging system.

Although the invention has been described with reference to a positive photoresist detector, in which the resist clears upon exposure to a clearing dose of actinic radiation, the invention is also applicable to a photoresist detector employing a negative resist, which covers any area when exposed to a covering dose of active radiation.

It will be appreciated that the invention is not restricted to the particular embodiments that have been described, and that variations may be made therein without departing from the scope of the invention as defined in the appended claims and equivalents thereof.

What is claimed is:

1. A method for determining a value of a parameter of an optical proximity correction model, the method comprising:
   (a) performing a first exposure of a mask onto a wafer, wherein the mask comprises a set of features;
   (b) performing a second exposure of the mask onto the wafer, wherein an exposure field of the second exposure partially overlaps an exposure field of the first exposure;
   (c) determining a characteristic of the set of features exposed onto the wafer by the first and second exposures; and
   (d) determining a value of a parameter of an optical proximity correction model based on the characteristic determined in (c).

2. The method of claim 1, wherein the mask comprises a frame around the set of features, wherein, in the first exposure, the frame prevents exposure of an area on the wafer surrounding the set of features, and wherein, in the second exposure, the frame prevents light from reaching areas on the wafer that were exposed in the first exposure.

3. The method of claim 1, wherein (d) comprises determining the value of a parameter through a comparison of the characteristic determined in (c) with a characteristic simulated from the optical proximity correction model based on the set of features on the mask and exposure conditions of the first and second exposures.

4. The method of claim 1, wherein the optical proximity correction model comprises a model of a mask manufacturing process.

5. The method of claim 1, wherein the optical proximity correction model comprises a model of an optical exposure process.

6. The method of claim 1, wherein the optical proximity correction model comprises a model of resist processing.

7. The method of claim 6, wherein the set of features comprises a line, and wherein (c) comprises measuring a width of the line.

8. The method of claim 6, wherein the set of features comprises a space pattern, and wherein (c) comprises measuring a width of the space pattern.

9. The method of claim 1, wherein the optical proximity correction model comprises a model of an etch process.

10. The method of claim 1, wherein the optical proximity correction model is operative to predict a printed wafer image based on a given layout using a description of image transformation of at least one step of a patterning process.

11. The method of claim 1, wherein the mask further comprises an alignment feature, and wherein the method further comprises aligning a measurement tool using alignment features exposed onto the wafer by the first and second exposures.

12. The method of claim 1, wherein the first and second exposures are performed using the same exposure conditions.

13. The method of claim 12, wherein the same exposure condition is used in both the first and second exposures, and the method further comprises reducing measurement noise on one of the characteristics determined in (c).

14. The method of claim 1, wherein the first and second exposures are performed using at least one different exposure condition.

15. The method of claim 14, wherein the at least one different exposure condition comprises at least one of the following: dose, focus, and illumination.

16. The method of claim 1 further comprising performing at least one additional exposure of the mask onto the wafer, wherein an exposure field of each of the at least one additional exposure partially overlaps an exposure field of a previous exposure, and wherein (c) comprises determining a characteristic of the set of features exposed onto the wafer by the first, second, and at least one additional exposures.

17. The method of claim 16, wherein the same exposure condition is used in at least some of the first, second, and at least one additional exposures, and the method further comprises reducing measurement noise on a characteristics determined in (c) using the exposures with the same exposure condition.

18. The method of claim 16, wherein the first, second, and at least one additional exposures are performed using at least one different exposure condition for each exposure.

19. The method of claim 18, wherein the at least one different exposure condition comprises at least one of the following: dose, focus, and illumination.

20. The method of claim 18 further comprising determining a dependency of the set of features and the at least one different exposure condition.

21. The method of claim 1, wherein the characteristic comprises critical dimension.

22. The method of claim 1, wherein the set of features comprises a bright feature.

23. The method of claim 1, wherein the set of features comprises a combination of bright and dark features.

24. The method of claim 1, wherein the set of features are placed in multiple field locations within the exposure field of the first exposure, wherein (c) is performed in a field-dependent manner, wherein the optical proximity correction model allows for position-dependent parameters, and wherein (d) is performed in a field-position dependent manner.

25. A method for determining a characteristic of a set of features exposed onto a wafer, the method comprising:
 (a) performing a first exposure of a mask at a first location on a wafer, wherein the mask comprises patterns for the set of features and an alignment feature;
 (b) performing a second exposure of the mask onto the wafer, wherein the second exposure patterns the set of features at a second location on the wafer;
 (c) aligning a measurement tool using the alignment features exposed onto the wafer by the first and second exposures and
 (d) using the measurement tool to measure dimensional characteristics of the set of features patterned at the first location on the wafer and the second location on the wafer.

26. The method of claim 25, wherein the mask comprises a frame around the set of features and the alignment feature, wherein, in the first exposure, the frame prevents exposure of an area on the wafer surrounding the set of features and the alignment feature, and wherein, in the second exposure, the frame prevents light from reaching areas on the wafer that were exposed in the first exposure.

27. The method of claim 25 further comprising performing at least one additional exposure of the mask onto the wafer, wherein an exposure field of each of the at least one additional exposure partially overlaps an exposure field of a previous exposure, and wherein (c) comprises aligning a measurement tool using the alignment features exposed onto the wafer by the first, second, and at least one additional exposures.

28. The method of claim 27, wherein the same exposure condition is used in at least some of the first, second, and at least one additional exposures, and wherein the method further comprises reducing measurement noise using the dimensional characteristic determined in (d) on the exposures with the same exposure condition.

29. The method of claim 27, wherein the first, second, and at least one additional exposures are performed using at least one different exposure condition for each exposure.

30. The method of claim 29, wherein the at least one different exposure condition comprises at least one of the following: dose, focus, and illumination.

31. The method of claim 29 further comprising determining a dependency of the set of features and the at least one different exposure condition.

32. The method of claim 25 further comprising determining a value of a parameter of an optical proximity correction model based on the dimensional characteristics measured in (d).

33. The method of claim 32, wherein the optical proximity correction model comprises a model of a mask manufacturing process.

34. The method of claim 32, wherein the optical proximity correction model comprises a model of an optical exposure process.

35. The method of claim 32, wherein the optical proximity correction model comprises a model of resist processing.

36. The method of claim 32, wherein the optical proximity correction model comprises a model of an etch process.

37. The method of claim 25, wherein the first and second exposures are performed using the same exposure conditions.

38. The method of claim 25, wherein the first and second exposures are performed using at least one different exposure condition.

39. The method of claim 38, wherein the at least one different exposure condition comprises at least one of the following: dose, focus, and illumination.

40. The method of claim 25, wherein the dimensional characteristic comprises critical dimension.

41. The method of claim 25, wherein the set of features comprises a bright feature.

42. The method of claim 25, wherein the set of features comprises a combination of bright and dark features.

* * * * *

UNITED STATES PATENT AND TRADEMARK OFFICE
CERTIFICATE OF CORRECTION

PATENT NO. : 7,588,868 B2
APPLICATION NO. : 10/971350
DATED : September 15, 2009
INVENTOR(S) : Franz X. Zach et al.

It is certified that error appears in the above-identified patent and that said Letters Patent is hereby corrected as shown below:

In the drawings:
Delete Figure 15 and insert the attached Figure 15.

Signed and Sealed this

Fifteenth Day of December, 2009

David J. Kappos
*Director of the United States Patent and Trademark Office*

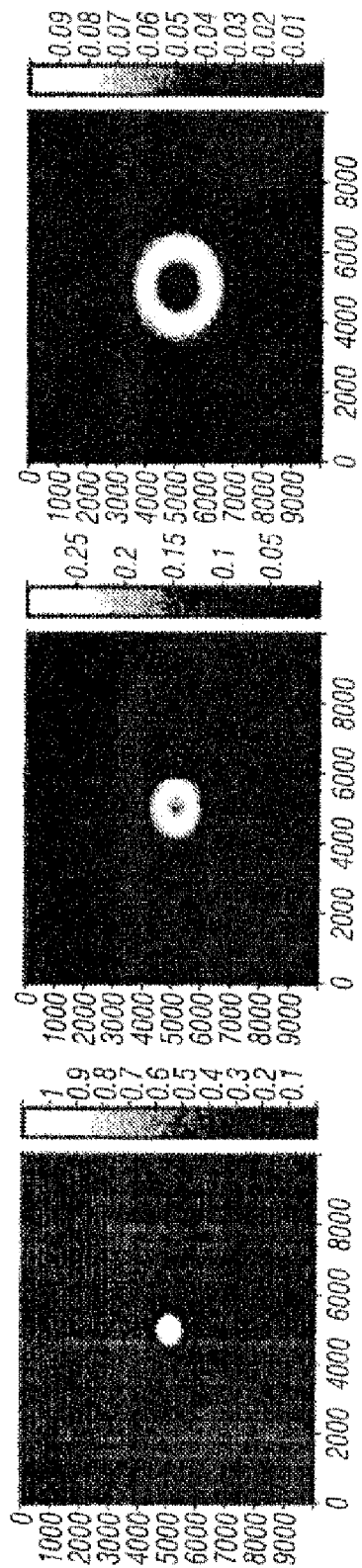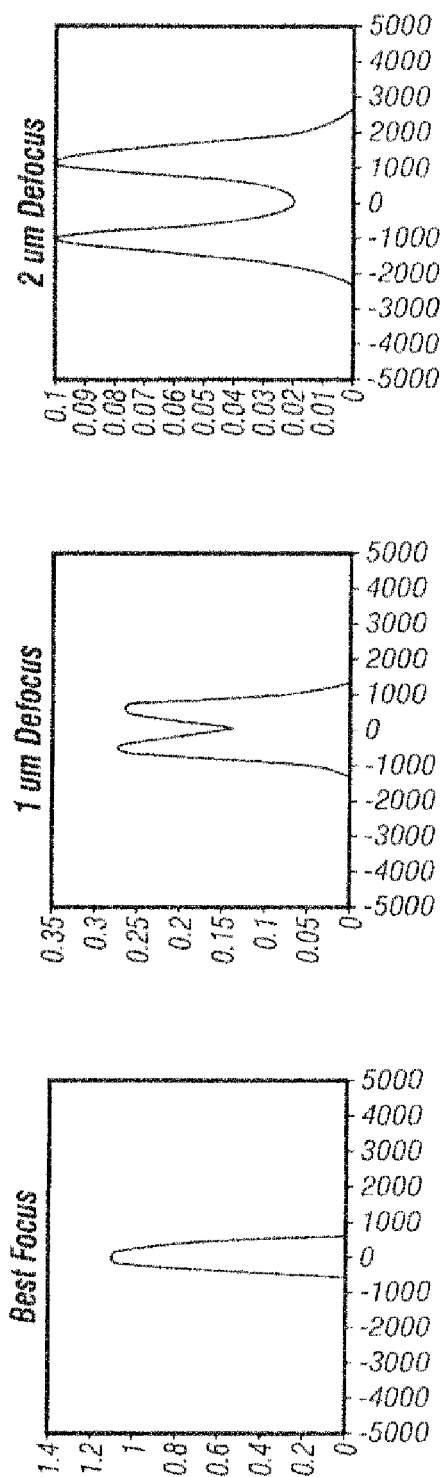
FIG. 15

UNITED STATES PATENT AND TRADEMARK OFFICE
CERTIFICATE OF CORRECTION

PATENT NO.       : 7,588,868 B2                                      Page 1 of 1
APPLICATION NO.  : 10/971350
DATED            : September 15, 2009
INVENTOR(S)      : Zach et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 1040 days.

Signed and Sealed this

Twenty-first Day of September, 2010

David J. Kappos
*Director of the United States Patent and Trademark Office*